(12) United States Patent
 Takamori et al.

(10) Patent No.: US 11,469,059 B2
(45) Date of Patent: Oct. 11, 2022

(54) SWITCH AND OPERATION DEVICE

(71) Applicant: OMRON Corporation, Kyoto (JP)

(72) Inventors: Satoshi Takamori, Okayama (JP); Koichi Furusawa, Okayama (JP)

(73) Assignee: OMRON Corporation, Kyoto (JP)

( * ) Notice: Subject to any disclaimer, the term of this patent is extended or adjusted under 35 U.S.C. 154(b) by 337 days.

(21) Appl. No.: 16/841,687

(22) Filed: Apr. 7, 2020

(65) Prior Publication Data
 US 2020/0365348 A1  Nov. 19, 2020

(30) Foreign Application Priority Data

May 13, 2019 (JP) .............................. JP2019-090926

(51) Int. Cl.
 *H01H 36/00* (2006.01)
 *H01H 13/14* (2006.01)
 (Continued)

(52) U.S. Cl.
 CPC ......... *H01H 13/14* (2013.01); *G06F 3/03543* (2013.01); *H01H 23/30* (2013.01); *H01H 25/04* (2013.01); *H03K 17/965* (2013.01)

(58) Field of Classification Search
 CPC ...... H01H 3/125; H01H 13/705; H01H 13/14; H01H 13/04; H01H 13/10; H01H 13/70; H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20; H01H 36/00; H01H 2221/04; H01H 2221/048; H01H 36/02; H01H 2215/042; H01H 36/0006; H01H 5/02; H01H 2221/022; H01H 36/0073; H01H 9/443; H01H 3/503; H01H 36/008; H03K 17/97; H03K 2217/94068; H03K 17/972; H03K 17/9622; H03K 17/95; H03K 2217/94015; H03K 2217/95; H03K 17/9515
 See application file for complete search history.

(56) References Cited

FOREIGN PATENT DOCUMENTS

| CN | 106648177 | 5/2017 |
| CN | 107193404 | 9/2017 |

(Continued)

OTHER PUBLICATIONS

"Office Action of Taiwan Counterpart Application", dated Sep. 4, 2020, with English translation thereof, p. 1-p. 15.

*Primary Examiner* — Ahmed M Saeed
(74) *Attorney, Agent, or Firm* — JCIPRNET

(57) ABSTRACT

Provided are a switch and an operation device which can expand the application range of switches using magnets, etc. A switch incorporated in an operation device includes a movable member with a first end side fixed and a second end side swinging when receiving a pressing, and a pressing member which presses the movable member, and further includes a permanent magnet (magnet) on the tip of the movable member, and a magnetic field detection part which detects a magnetic field. In response to an operation on the operation device, the pressing member of the switch presses the movable member downward. The magnetic field generated by the permanent magnet (magnet) and detected by the magnetic field detection part changes due to the pressing of the pressing member, and the switch outputs a signal based on the magnetic field detected by the magnetic field detection part.

7 Claims, 27 Drawing Sheets

(51) Int. Cl.
*G06F 3/0354* (2013.01)
*H01H 23/30* (2006.01)
*H01H 25/04* (2006.01)
*H03K 17/965* (2006.01)

(56) References Cited

FOREIGN PATENT DOCUMENTS

| | | |
|---|---|---|
| CN | 206975617 | 2/2018 |
| CN | 108520841 | 9/2018 |
| CN | 106158477 | 10/2018 |
| TW | 433536 | 5/2001 |
| TW | 201816555 | 5/2018 |

SWITCH AND OPERATION DEVICE

CROSS-REFERENCE TO RELATED APPLICATION

This application claims the priority benefit of Japan application serial no. 2019-090926, filed on May 13, 2019. The entirety of the above-mentioned patent application is hereby incorporated by reference herein and made a part of this specification.

BACKGROUND

Technical Field

The disclosure relates to a switch which includes a movable member and a pressing member for pressing the movable member, and which outputs a signal based on the swing of the movable member due to the pressing by the pressing member, and to an operation device using the switch.

Description of Related Art

An operation device such as a mouse provided with a switch such as a microswitch has become popular as an input device for an electronic device such as a computer. Switches such as microswitches include contacts for turning on and off circuits, but recently, switches without physical contacts for turning on and off circuits have become popular. For example, Patent Document 1 discloses a switch which turns on and off a circuit with a photoelectric contact using a photosensor and which generates a click feeling by the magnetic force of a permanent magnet.

RELATED ART

Patent Document

[Patent Document 1] The Specification of Chinese Patent Publication No. 106648177

SUMMARY

There is a high expectation for further development of switches without physical contacts, and for example, various applications are being studied for switches using magnets.

The disclosure has been made in view of such circumstances, and the disclosure mainly provides a switch which can expand the application range of switches using magnets by turning on and off a circuit based on a detection result of the magnetic field caused by the magnet.

The disclosure further provides an operation device using the switch.

In view of the above issues, a switch according to the disclosure includes a movable member in which a first end side is fixed and a second end side swings when receiving a pressing; a pressing member which presses the movable member, wherein the switch outputs a signal based on a swing of the movable member caused by a pressing by the pressing member; a magnet; and a magnetic field detection part which detects a magnetic field, wherein a magnetic field generated by the magnet and detected by the magnetic field detection part is changed due to the pressing of the pressing member, and a signal is output based on the magnetic field detected by the magnetic field detection part.

Further, in the above switch, the magnetic field detected by the magnetic field detection part changes as the magnet operates with respect to the magnetic field detection part due to the swing of the movable member caused by the pressing of the pressing member.

Further, in the above switch, the magnet is located on the second end side of the movable member.

Further, in the above switch, the magnet is attached to the second end side of the movable member.

Further, in the above switch, the movable member is formed by a metal material, and the magnet is the second end side that has been magnetized.

Further, in the above switch, the magnetic field detected by the magnetic field detection part changes as the magnet located on the second end side operates to approach or move away from the magnetic field detection part due to the swing of the movable member.

Further, in the above switch, the second end side of the movable member is bent toward the magnetic field detection part, and the magnetic field detected by the magnetic field detection part changes as the magnet located on the second end side of the movable member operates to approach the magnetic field detection part in a bending direction due to the swing of the movable member.

Further, in the above switch, the second end side of the movable member is bent toward the magnetic field detection part, and the magnetic field detected by the magnetic field detection part changes as the magnet located on the second end side of the movable member performs an operation including a component of moving in a direction substantially orthogonal to a bending direction due to the swing of the movable member.

Further, the above switch further includes a pusher which moves in response to a pressing of the movable member, wherein the movable member is configured to press the pusher by swinging, the pusher is configured to press the magnet by movement caused by a pressing, and the magnetic field detected by the magnetic field detection part changes as the magnet operates in response to a pressing.

Further, in the above switch, the pusher is configured to move toward the magnetic field detection part by the pressing of the movable member, and the pusher is configured to press the magnet in a direction different from a movement direction.

Further, the above switch further includes a connection member magnetically connectable to two poles of the magnet, wherein the magnet and the connection member are disposed in a way in which one of the magnet and the connection member is movable toward and away from the other, and the magnetic field generated by the magnet is detectable by the magnetic field detection part in a case where the magnet and the connection member move away from each other, and the pusher is configured to move in a way in which one of the magnet and the connection member is magnetically connected to or separated from the other due to the pressing of the movable member.

Further, in the above switch, the magnetic field detection part detects a change in a direction of the magnetic field.

Further, the above switch further includes an attraction member which attracts the movable member in a direction opposite to the pressing of the pressing member by being attracted to the magnet located on the second end side of the movable member by a magnetic force.

Further, in the above switch, the magnet is attached to the pressing member, and the magnetic field detected by the magnetic field detection part changes as the magnet operates with respect to the magnetic field detection part due to a movement of the pressing member to press the movable member.

Further, in the above switch, the magnet and the magnetic field detection part are disposed to face each other, the movable member has a shielding part located between the magnet and the magnetic field detection part on the second end side, and the magnetic field detected by the magnetic field detection part changes due to an operation of shielding or transmitting the magnetic field that reaches the magnetic field detection part from the magnet due to the swing of the movable member caused by the pressing of the pressing member.

Further, in the above switch, the shielding part is formed by a paramagnetic material or a ferromagnetic material.

Further, an operation device according to the disclosure includes a pressing operation part which receives a pressing operation from outside; and the switch as described above, wherein the pressing operation received by the pressing operation part is transmitted as a pressing from the outside, wherein a signal is output based on a change in the magnetic field detected by the magnetic field detection part.

The switch and the operation device according to the disclosure include a magnet and a magnetic field detection part, and output a signal based on the magnetic field detected by the magnetic field detection part.

A switch and an operation device according to the disclosure include a magnetic field detection part and output a signal based on the magnetic field detected by the magnetic field detection part. The use of the magnetic field detection part provides good effects such as the possibility of expanding the application range of switches and operation devices using magnets. For example, when the switch and the operation device are configured to turn on and off a circuit and to generate a click feeling by a magnet, as compared with a switch that turns on and off the circuit with a photoelectric contact and that generates a click feeling by the magnetic force of a permanent magnet, good effects such as suppression of increase in manufacturing costs can be expected.

DESCRIPTION OF THE EMBODIMENTS

Application Example

Figure 1:
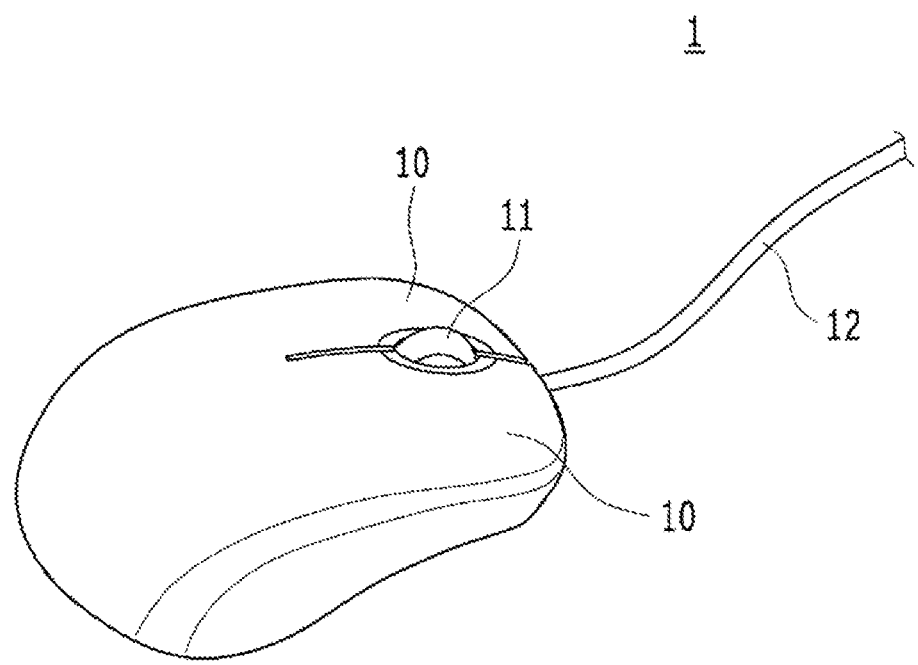
FIG. 1 is a schematic perspective view showing an example of the appearance of the operation device according to the disclosure.

The operation device according to the disclosure is used, for example, as an operation device such as a mouse used for operating a personal computer (hereinafter referred to as a PC). In addition, the switch according to the disclosure is used as a microswitch in devices such as various electronic machines including an operation device. Hereinafter, an operation device 1 and a switch 2 illustrated in the drawings will be described with reference to the drawings.

<Operation Device 1>

First, the operation device 1 will be described. FIG. 1 is a schematic perspective view showing an example of the appearance of the operation device 1 according to the disclosure. FIG. 1 shows an example in which the operation device 1 according to the disclosure is applied to a mouse used for operating an electronic machine such as a PC. The operation device 1 includes a pressing operation part 10 such as a mouse button that receives an operation of pressing by a finger of a user, and a rotation operation part 11 such as a mouse wheel that receives an operation of rotating by a finger of the user. The rotation operation part 11 is configured to receive not only a rotation operation but also a pressing operation, and also functions as the pressing operation part 10. Further, the operation device 1 is connected to a signal line 12 that outputs an electric signal to an external machine such as a PC. In addition, the operation device 1 is not limited to using wired communication through the signal line 12, and can output an electric signal by various communication methods such as wireless communication.

The switch 2 (to be described later) is accommodated in the operation device 1 for each of the pressing operation part 10 and the rotation operation part 11. When a pressing operation is performed on the pressing operation part 10, a part inside the pressing operation part 10 presses the corresponding switch 2. The switch 2 outputs a signal based on the pressing state through the signal line 12 to an external electronic machine such as a PC.

That is, the operation device 1 according to the disclosure includes the pressing operation part 10 that receives a pressing operation from the outside, and the rotation operation part 11 that receives an operation such as a rotation operation, and further includes the switch 2 inside. Further, the operation device 1 transmits the pressing operation received by the pressing operation part 10 and/or the rotation operation part 11 to the switch 2 as a pressing from the outside, and outputs a signal based on the operation of the switch 2 to an external electronic machine.

<Switch 2>

Next, the switch 2 accommodated in the operation device 1 will be described. The switch 2 included in the operation device 1 according to the disclosure can be realized in various forms. Here, for example, the first embodiment to the tenth embodiment will be described.

First Embodiment

Figure 2:
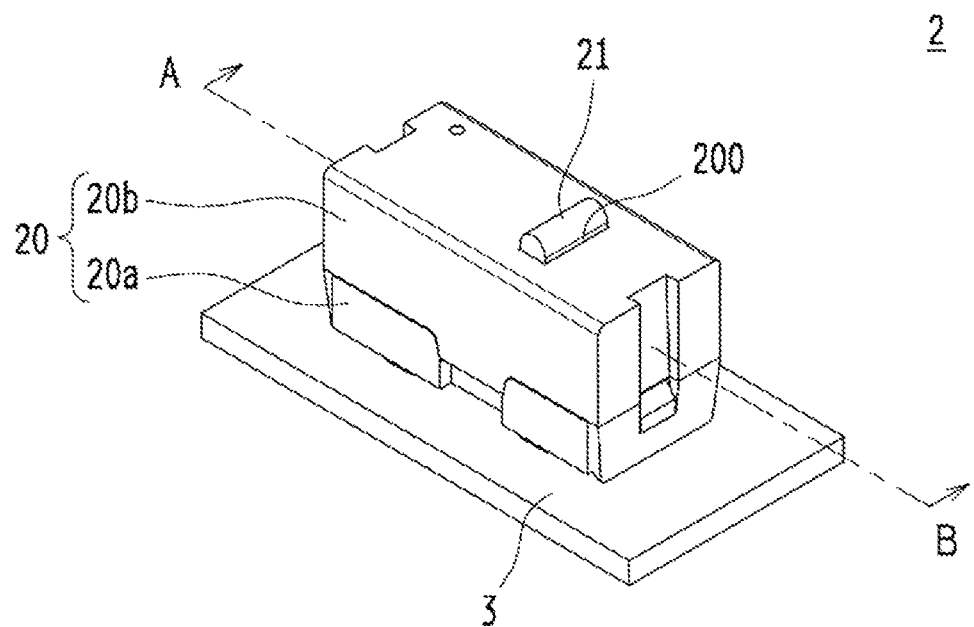
FIG. 2 is a schematic perspective view showing an example of the appearance of the switch according to the disclosure.

FIG. 2 is a schematic perspective view showing an example of the appearance of the switch 2 according to the disclosure. In addition, in the disclosure, the directions of the switch 2, with reference to FIG. 2, are expressed by the following: the left front side is front, the right rear side is rear, the upper side is up, the lower side is down, the left rear side is left, and the right front side is right. However, these directions are for convenience of description, and do not limit the mounting direction of the switch 2. As described above, the switch 2 is accommodated as a microswitch inside an electronic machine such as the operation device 1 and receives a pressing operation received by parts such as the pressing operation part 10 of the operation device 1 as a pressing from the outside.

The switch 2 is fixed on a substrate 3 on which electronic components such as various circuits, wirings, and elements are mounted. The switch 2 includes a housing 20 having a substantially rectangular parallelepiped shape. The housing 20 is formed by a base 20a in the lower part and a cover 20b in the upper part. An insertion hole 200 in a rectangular shape through which a pressing member 21 is inserted is formed on the upper surface of the housing 20 at a position on the right side from the center when viewed from the front. The pressing member 21 inserted into the insertion hole 200 is a member that moves up and down in response to a pressing from the outside of the housing 20, and the upper end of the pressing member 21 protrudes from the upper surface of the housing 20.

In the switch 2 formed in this way, a pressing operation from the outside received by the operation device 1 is transmitted to the pressing member 21 as a pressing from the outside of the housing 20. The pressing member 21 moves from the top dead center to the bottom dead center in response to the pressing from the outside, and moves from the bottom dead center to the top dead center when released from the pressing from the outside.

Figure 3:
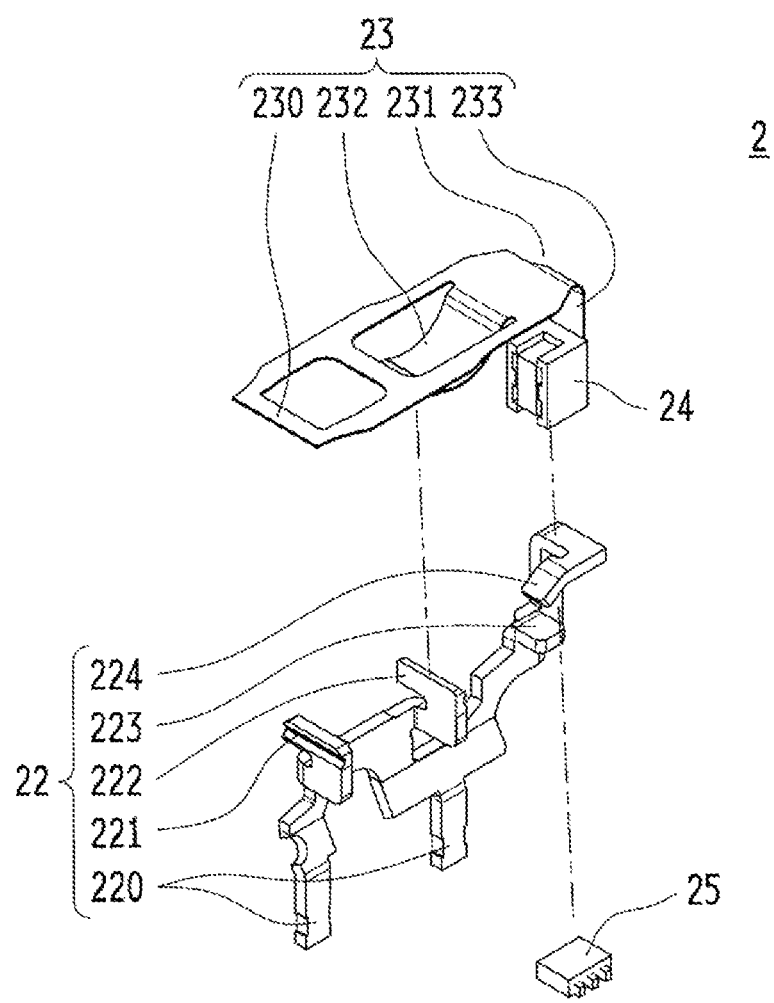
FIG. 3 is a schematic perspective view showing an example of the internal structure of the switch according to the disclosure.
Figure 4:
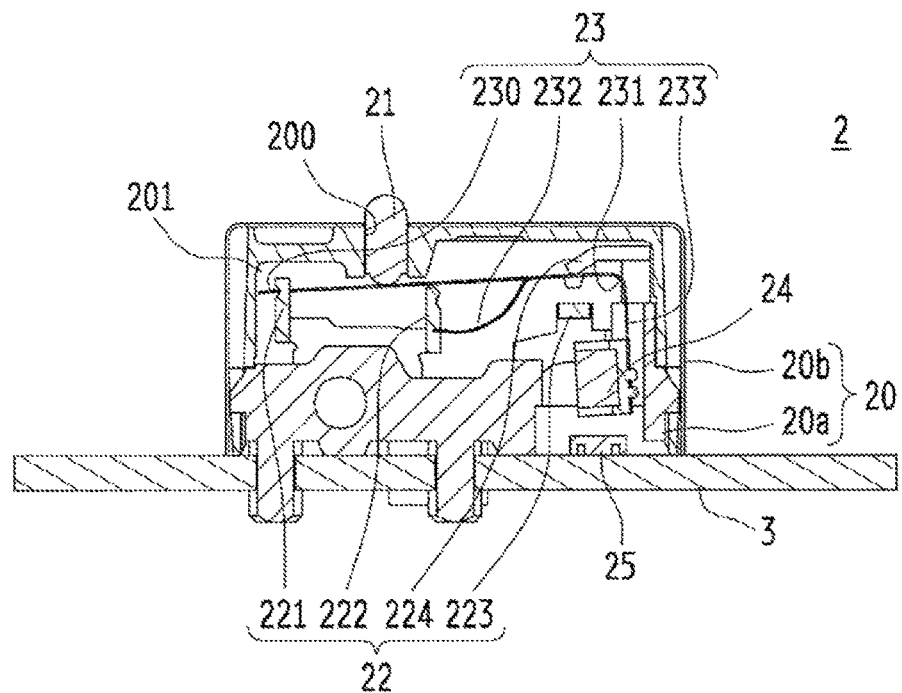
FIG. 4 is a schematic cross-sectional view showing an example of a cross section of the switch according to the disclosure.

Next, the internal structure of the switch 2 will be described. FIG. 3 is a schematic perspective view showing an example of the internal structure of the switch 2 according to the disclosure. FIG. 3 is a schematic perspective view showing internal members by removing the housing 20 and the pressing member 21 from the switch 2. FIG. 4 is a schematic cross-sectional view showing an example of a cross section of the switch 2 according to the disclosure. FIG. 4 shows a cross section taken along a vertical plane including the line AB shown in FIG. 2 from a front perspective.

In the housing 20 of the switch 2, a region is secured as a contact chamber 201 that accommodates a contact mechanism that turns on and off an electric circuit. The insertion hole 200 penetrating from the outside of the housing 20 is formed on the upper surface of the contact chamber 201, and the pressing member 21 is inserted into the insertion hole 200.

The contact mechanism accommodated in the contact chamber 201 will be described. In the contact chamber 201, various members such as a locking member 22, a movable member 23, and a permanent magnet 24 are disposed as the contact mechanism, and a magnetic field detection part 25 is disposed at the lower right of the housing 20. The contact mechanism according to the first embodiment is formed as a snap action mechanism that switches contacts quickly when the pressing of the pressing member 21 reaches a predetermined position.

The locking member 22 is a member formed by molding a metal plate, and is fixed in the contact chamber 201 so as to lock the movable member 23 in the contact chamber 201. The locking member 22 includes parts such as a leg part 220, a first support part 221, a second support part 222, a first contact part 223, and a second contact part 224. The leg part 220 is a part that is inserted into the base 20a at the lower part of the housing 20, and the locking member 22 is fixed in an upright state in the contact chamber 201 of the housing 20 by the leg part 220 being inserted into the lower part of the housing 20. The first support part 221 is a part that protrudes upward at the left end side in the contact chamber 201, and supports the movable member 23 in a swingable manner. The second support part 222 is a part that protrudes upward in the vicinity of the center in the contact chamber 201, and supports the movable member 23 in a swingable manner. The first contact part 223 is a part that contacts the swinging movable member 23 from the lower right side, and regulates the swing range of the movable member 23 from below. The second contact part 224 is a part that contacts the swinging movable member 23 from the upper right side, and regulates the swing range of the movable member 23 from above.

The movable member 23 is a flexible member formed by a thin metal plate, and is disposed in the contact chamber 201 to extend in the left-right direction. The left end of the movable member 23 is a fixed end (hereinafter referred to as a first end 230) that is locked to the first support part 221 of the locking member 22 and functions as a swing fulcrum. The right end of the movable member 23 is a free end (hereinafter referred to as a second end 231) that moves between the first contact part 223 and the second contact part 224, and the swing range of the second end 231 is regulated by the first contact part 223 and the second contact part 224. The movable member 23 includes an urging part 232 that functions as a return spring which is punched out in the vicinity of the center of the movable member 23 and which is bent in an arc shape. The urging part 232 has a substantially rectangular shape in a plan view, and a short side on the right side is connected to the outer frame part of the movable member 23, and a short side on the left side and both long sides are formed as a detached tongue-shaped piece. The urging part 232 has a shape that is bent in an arc shape convex downward so that the part of the punched-out tongue-shaped piece functions as a return spring. The left end of the punched urging part 232 is formed in the second support part 222 located in the vicinity of the center in the contact chamber 201. The urging part 232 generates a reaction force against the pressing of the pressing member 21. On the second end 231 side of the movable member 23, a tip part is a bent piece 233 bent downward at a substantially right angle, and the permanent magnet 24 is attached to the tip of the bent piece 233.

The magnetic field detection part 25 includes a Hall element that detects a magnetic field by the Hall effect, and is configured by a Hall IC that outputs an internal signal based on a change in the magnetic field detected by the Hall element. The magnetic field detection part 25 is formed as a surface-mount type chip, and is surface-mounted on the substrate 3 at the lower right of the housing 20. The Hall element has various specifications such as one-sided detection that detects the approach of magnetic flux from one pole, two-sided detection that detects the approach of magnetic flux from two poles, and alternating detection that detects the change in the pole related to the magnetic flux. However, in the embodiment, a Hall element of one-sided detection or two-sided detection is preferable.

In the contact mechanism configured as described above, the pressing member 21 receives a pressing from the outside and moves downward to press the movable member 23. When the movable member 23 is pressed, the movable member 23 is lowered until the second end 231 side contacts the first contact part 223, and the permanent magnet 24 attached to the bent piece 233 at the tip also moves downward.

When the pressing of the pressing member 21 is released, the movable member 23 is urged upward by the reaction force of the urging part 232. When the movable member 23 is urged upward, the pressing member 21 moves upward. Further, as the movable member 23 is urged upward by the urging part 232, the second end 231 side of the movable member 23 is raised and contacts the second contact part 224.

Figure 5A:
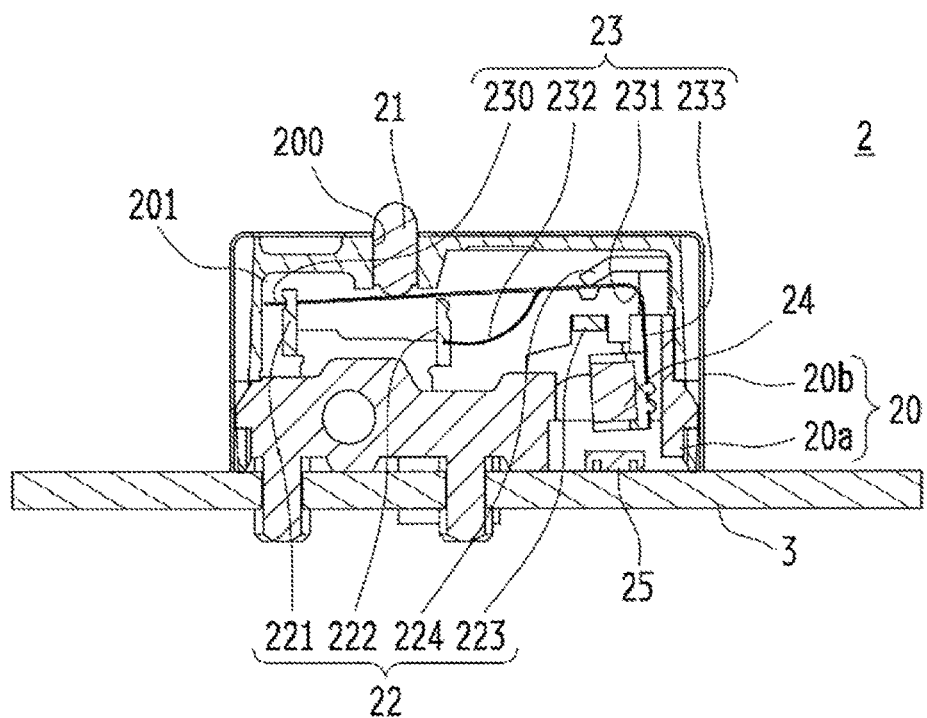
FIG. 5A is a schematic cross-sectional view showing an example of the switch according to the disclosure.
Figure 5B:
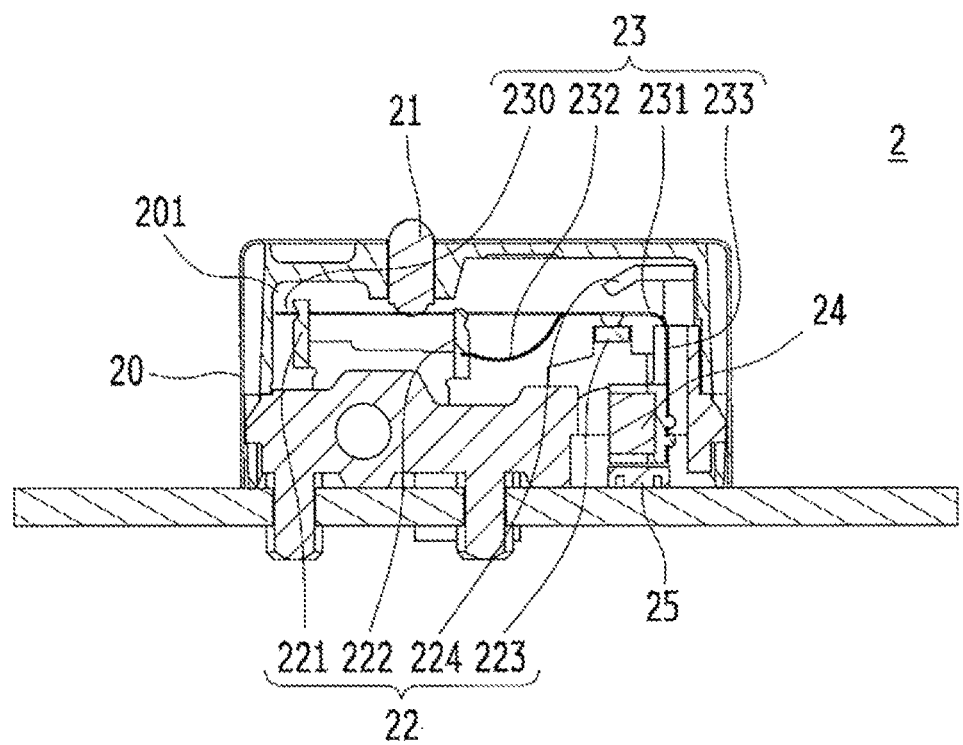
FIG. 5B is a schematic cross-sectional view showing an example of the switch according to the disclosure.

Next, the operation of the switch 2 according to the disclosure will be described. FIG. 5A and FIG. 5B are schematic cross-sectional views showing an example of the switch 2 according to the disclosure. FIG. 5A shows a state where the pressing member 21 does not receive a pressing from the outside, and FIG. 5B shows a state where the pressing member 21 receives a pressing from the outside and moves downward.

As illustrated in FIG. 5A, when the pressing member 21 does not receive a pressing from the outside, the pressing member 21 is located at the top dead center. In the state illustrated in FIG. 5A, since the movable member 23 is pushed upward by the urging part 232 with a reaction force against the pressing of the pressing member 21, the second end 231 side contacts the second contact part 224 disposed on the upper right side in the contact chamber 201.

When the pressing member 21 moves downward, the pressing member 21 presses the movable member 23 downward. The entire movable member 23 is pressed by the pressing member 21 and tends to move downward with the part locked by the first support part 221 as a swing axis. However, since the movable member 23 is pushed upward by the urging part 232 with a reaction force against the pressing of the pressing member 21, the movable member 23 maintains a state of being in contact with the second contact part 224 disposed on the upper right side in the contact chamber 201. Therefore, the movable member 23 receives the pressing from the pressing member 21 and is bent downward to be in a flexed state.

When the pressing member 21 moves further downward, the entire movable member 23 is pressed by the pressing member 21 and tends to move downward with the part locked by the first support part 221 as a swing axis. Then, since the urging part 232 of the movable member 23 swings downward with the part locked by the second support part 222 as a swing axis, the entire movable member 23 swings with the first support part 221 as the swing axis so as to be contra-rotated. The second end 231 side of the movable member 23 comes into contact with the first contact part 223 by the swing with the first support part 221 as the swing axis. That is, it becomes the state illustrated in FIG. 5B. Since the movable member 23 collides with the first contact part 223 with the force of the contra-rotation, an impact is caused. The user perceives the change in the sound and the pressing load caused by the impact due to the contra-rotation and the collision as the click sound and the click feeling.

When the pressing of the pressing member 21 is released, the movable member 23 is urged upward by the reaction force of the urging part 232. When the movable member 23 is urged upward, the pressing member 21 moves upward. Further, as the movable member 23 is urged upward by the urging part 232, the second end 231 side of the movable member 23 is raised and contacts the second contact part 224. That is, it becomes the state illustrated in FIG. 5A.

As illustrated in FIG. 5A, when the pressing member 21 does not receive a pressing from the outside, since the right end of the movable member 23 is located above, the permanent magnet 24 attached to the bent piece 233 of the movable member 23 is sufficiently upward away from the magnetic field detection part 25.

As illustrated in FIG. 5B, when the pressing member 21 receives a pressing from the outside, since the right end of the movable member 23 is located below, the permanent magnet 24 attached to the bent piece 233 of the movable member 23 contacts or approaches the magnetic field detection part 25. As the permanent magnet 24 contacts or approaches the magnetic field detection part 25, the magnetic field detectable by the Hall element of the magnetic field detection part 25 changes. The change of the magnetic field detected by the Hall element is output by the magnetic field detection part 25 as an internal signal, and is output by the switch 2 to the operation device 1 as an ON signal.

As described above, in the switch 2 according to the disclosure, the permanent magnet 24 located on the second end 231 side of the movable member 23 approaches the magnetic field detection part 25 by the swing of the movable member 23 caused by the pressing of the pressing member 21. As the permanent magnet 24 approaches the magnetic field detection part 25, the magnetic field detected by the magnetic field detection part 25 changes. When the magnetic field detected by the magnetic field detection part 25 changes, the switch 2 outputs an ON signal. Further, since the swing of the movable member 23 involves a change in the pressing load and the generation of a collision sound, the user perceives the click feeling and the click sound.

Second Embodiment

The second embodiment is different from the first embodiment in that the magnetic field detection part 25 is not disposed below the permanent magnet 24 attached to the movable member 23; instead, the magnetic field detection part 25 is attached to the side of the permanent magnet 24. In the following description, the same components as those in the first embodiment are denoted by the same reference numerals as those in the first embodiment, and the first embodiment is referred to, and the detailed description is omitted.

Figure 6:
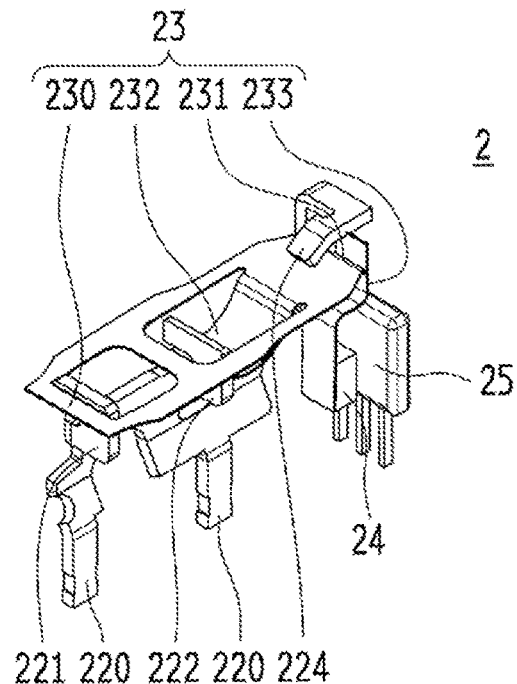
FIG. 6 is a schematic perspective view showing an example of the internal structure of the switch according to the disclosure.
Figure 7:
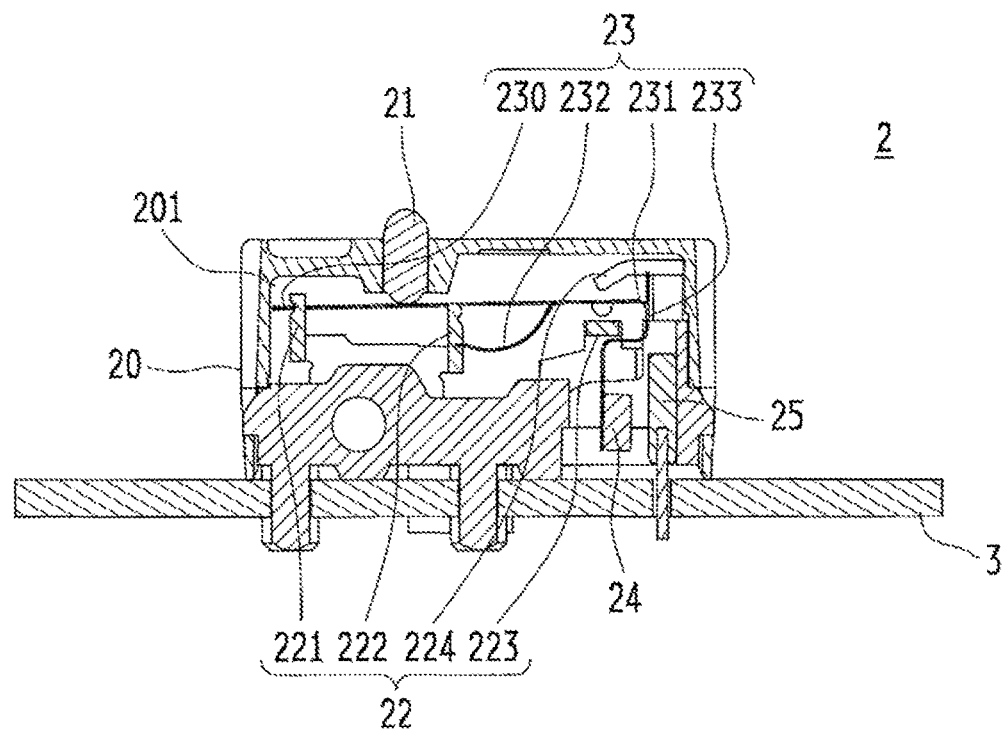
FIG. 7 is a schematic cross-sectional view showing an example of a cross section of the switch according to the disclosure.

FIG. 6 is a schematic perspective view showing an example of the internal structure of the switch 2 according to the disclosure. FIG. 7 is a schematic cross-sectional view showing an example of a cross section of the switch 2 according to the disclosure. FIG. 6 is a schematic perspective view showing internal members by removing the housing 20 from the switch 2.

In the switch 2 according to the second embodiment, the magnetic field detection part 25 is disposed on the right wall surface in the housing 20 on the second end 231 side of the movable member 23. The magnetic field detection part 25 is not the surface-mount type illustrated in the first embodiment, but has a terminal extending from a built-in Hall element to the substrate 3 and solders the terminal to the substrate 3. Since the movable member 23 swings in response to the pressing from the pressing member 21, the permanent magnet 24 attached to the bent piece 233 on the second end 231 side moves in an arc shape due to the swing. The arc-shaped movement has a movement component in the left-right direction. That is, the permanent magnet 24 attached to the bent piece 233 of the movable member 23 performs a movement including a component in the left-right direction substantially orthogonal to the up-down direction that is the bending direction of the bent piece 233 of the movable member 23. Therefore, the magnetic field detection part 25 detects the arc-shaped movement of the permanent magnet 24 due to the swing of the movable member 23 as a change in the magnetic field due to the approach or moving away of the permanent magnet 24.

Figure 8A:
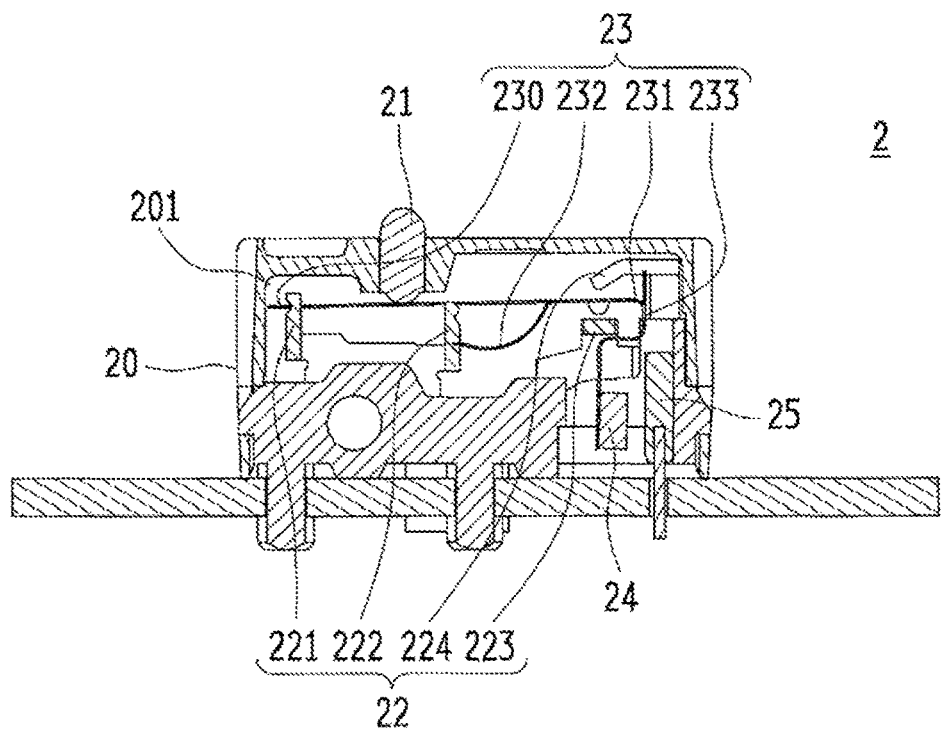
FIG. 8A is a schematic cross-sectional view showing an example of the switch according to the disclosure.
Figure 8B:
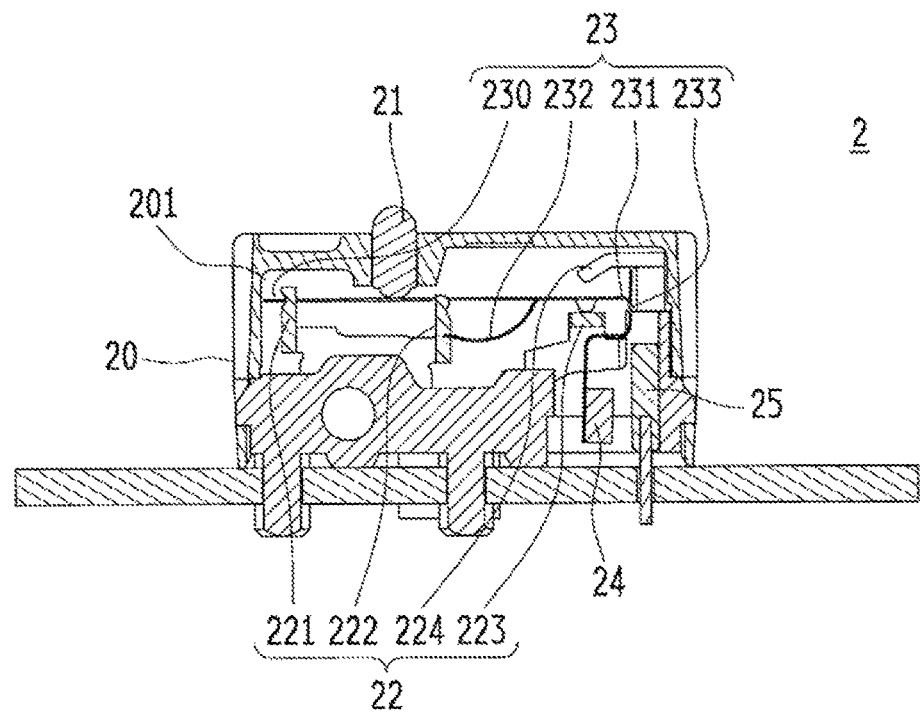
FIG. 8B is a schematic cross-sectional view showing an example of the switch according to the disclosure.

Next, the operation of the switch 2 according to the disclosure will be described. FIG. 8A and FIG. 8B are schematic cross-sectional views showing an example of the switch 2 according to the disclosure. FIG. 8A shows a state where the pressing member 21 does not receive a pressing from the outside, and FIG. 8B shows a state where the pressing member 21 receives a pressing from the outside and moves downward.

When the pressing member 21 moves downward and presses the movable member 23 downward, the second end 231 side of the movable member 23 swings downward, and the movable member 23 contra-rotates and contacts the first contact part 223. Since the movable member 23 collides with the first contact part 223 with the force of the contra-rotation, the user perceives the change in the sound and the pressing load caused by the impact due to the contra-rotation and the collision as the click sound and the click feeling.

Further, as illustrated in FIG. 8A, when the pressing member 21 does not receive a pressing from the outside, the permanent magnet 24 attached to the bent piece 233 of the movable member 23 approaches the magnetic field detection part 25.

As illustrated in FIG. 8B, when the pressing member 21 receives a pressing from the outside, the movable member 23 swings in an arc shape, and the permanent magnet 24 attached to the bent piece 233 of the movable member 23 moves in a direction away from the magnetic field detection part 25. As the permanent magnet 24 moves away, the magnetic field detectable by the Hall element of the magnetic field detection part 25 changes. The change of the magnetic field detected by the Hall element is output by the magnetic field detection part 25 as an internal signal, and is output by the switch 2 to the operation device 1 as an ON signal.

As described above, in the switch 2 according to the disclosure, the permanent magnet 24 attached to the bent piece 233 of the movable member 23 moves away from the magnetic field detection part 25 by the swing of the movable member 23 caused by the pressing of the pressing member 21. As the permanent magnet 24 moves away from the magnetic field detection part 25, the magnetic field detected by the magnetic field detection part 25 changes. When the magnetic field detected by the magnetic field detection part 25 changes, the switch 2 outputs an ON signal. Further, since the swing of the movable member 23 involves a change in the pressing load and the generation of a collision sound, the user perceives the click feeling and the click sound.

Third Embodiment

The third embodiment is different from the first embodiment in that the permanent magnet 24 is not attached to the movable member 23; instead, the second end 231 side of the movable member 23 is magnetized to be used as a magnet. In the following description, the same components as those in the first embodiment or the second embodiment are denoted by the same reference numerals as those in the first embodiment and the second embodiment, and the first embodiment and the second embodiment are referred to, and the detailed description is omitted.

Figure 9:
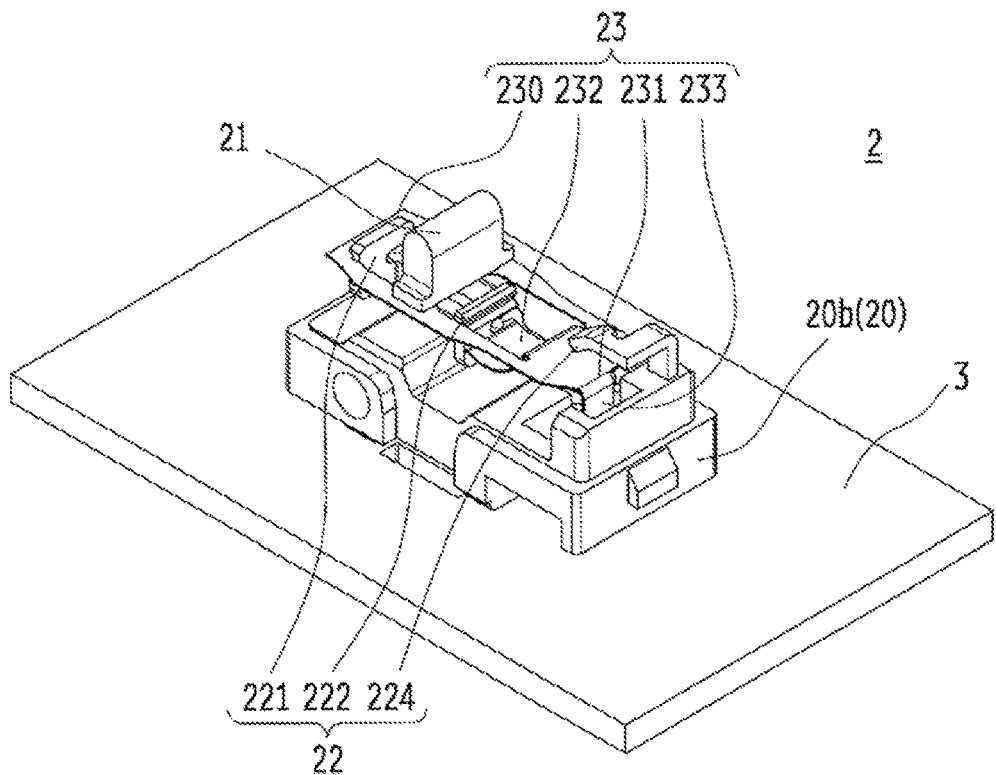
FIG. 9 is a schematic perspective view showing an example of the internal structure of the switch according to the disclosure.
Figure 10:
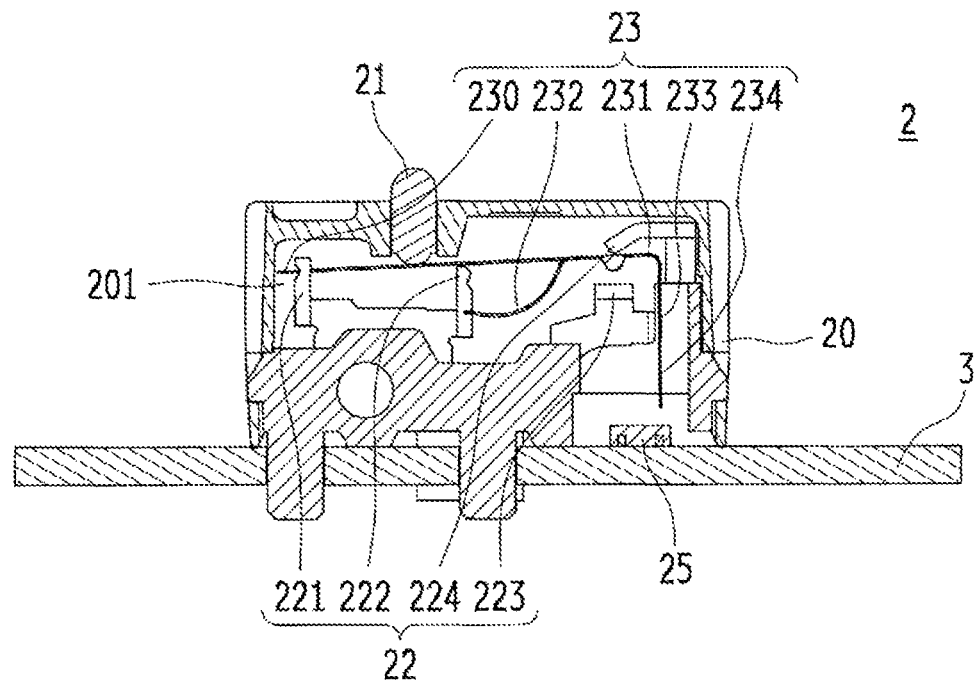
FIG. 10 is a schematic cross-sectional view showing an example of a cross section of the switch according to the disclosure.
Figure 11:
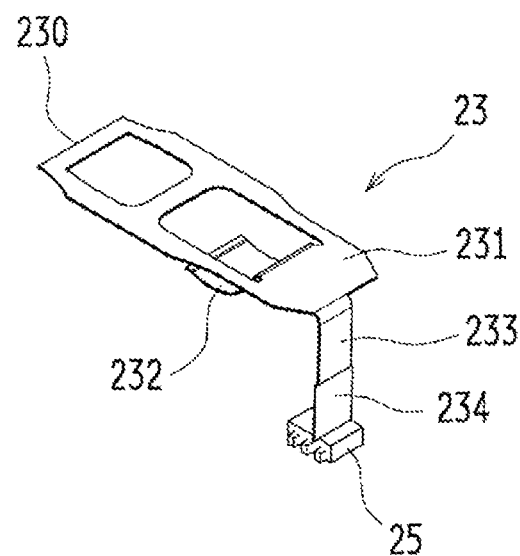
FIG. 11 is a schematic perspective view showing an example of the movable member and the magnetic field detection part included in the switch according to the disclosure.

FIG. 9 is a schematic perspective view showing an example of the internal structure of the switch 2 according to the disclosure. FIG. 10 is a schematic cross-sectional view showing an example of a cross section of the switch 2 according to the disclosure. FIG. 11 is a schematic perspective view showing an example of the movable member 23 and the magnetic field detection part 25 included in the switch 2 according to the disclosure. FIG. 9 is a schematic perspective view showing internal members by removing the cover 20b of the housing 20 from the switch 2.

In the switch 2 according to the third embodiment, the movable member 23 is formed by a non-magnetic material such as austenitic stainless steel, but the tip part of the bent piece 233 on the second end 231 side is a magnetized part 234 (magnet) that is partially magnetized. The magnetized part 234 is formed, for example, by cold working only the tip part of the bent piece 233 of the movable member 23 formed by austenitic stainless steel, so that the cold worked tip part is magnetized by being transformed into martensite of a magnetic material. The magnetized part 234 of the movable member 23 formed by magnetization extends from above the magnetic field detection part 25 to the magnetic field detection part 25 below and functions as a magnet for generating a magnetic field detected by the magnetic field detection part 25.

Figure 12A:
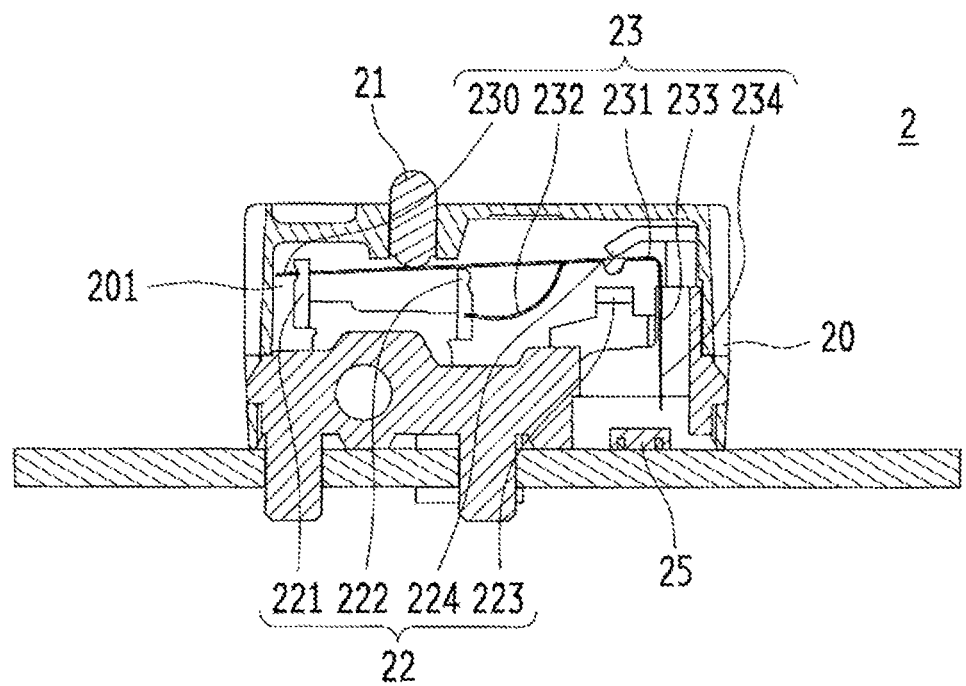
FIG. 12A is a schematic cross-sectional view showing an example of the switch according to the disclosure.
Figure 12B:
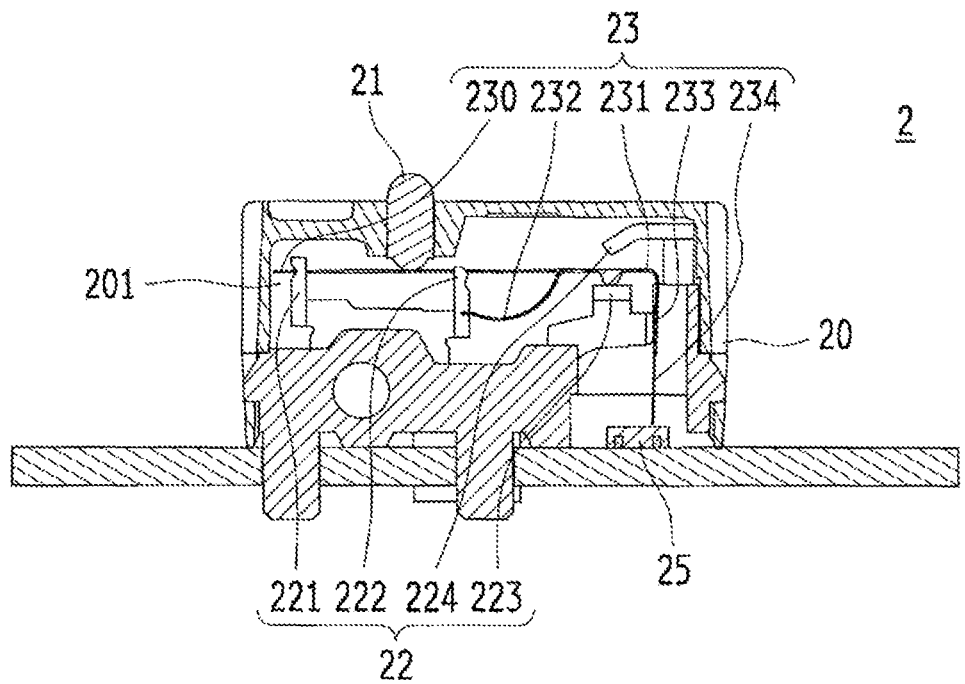
FIG. 12B is a schematic cross-sectional view showing an example of the switch according to the disclosure.

Next, the operation of the switch 2 according to the disclosure will be described. FIG. 12A and FIG. 12B are schematic cross-sectional views showing an example of the switch 2 according to the disclosure. FIG. 12A shows a state where the pressing member 21 does not receive a pressing from the outside, and FIG. 12B shows a state where the pressing member 21 receives a pressing from the outside and moves downward.

When the pressing member 21 moves downward and presses the movable member 23 downward, the second end 231 side of the movable member 23 swings downward, and the movable member 23 contra-rotates and contacts the first contact part 223. Since the movable member 23 collides with the first contact part 223 with the force of the contra-rotation, the user perceives the change in the sound and the pressing load caused by the impact due to the contra-rotation and the collision as the click sound and the click feeling.

Further, as illustrated in FIG. 12A, when the pressing member 21 does not receive a pressing from the outside, since the right end of the movable member 23 is located above, the magnetized part 234 located at the tip of the bent piece 233 of the movable member 23 is sufficiently upward away from the magnetic field detection part 25.

As illustrated in FIG. 12B, when the pressing member 21 receives a pressing from the outside, since the right end of the movable member 23 is located below, the magnetized part 234 located at the tip of the bent piece 233 of the movable member 23 contacts or approaches the magnetic field detection part 25. As the magnetized part 234 contacts or approaches the magnetic field detection part 25, the magnetic field detectable by the Hall element of the magnetic field detection part 25 changes. The change of the magnetic field detected by the Hall element is output by the magnetic field detection part 25 as an internal signal, and is output by the switch 2 to the operation device 1 as an ON signal.

As described above, in the switch 2 according to the disclosure, the magnetized part 234 located on the second end 231 side of the movable member 23 approaches the magnetic field detection part 25 by the swing of the movable member 23 caused by the pressing of the pressing member 21. As the magnetized part 234 approaches the magnetic field detection part 25, the magnetic field detected by the magnetic field detection part 25 changes. When the magnetic field detected by the magnetic field detection part 25 changes, the switch 2 outputs an ON signal. Further, since the swing of the movable member 23 involves a change in the pressing load and the generation of a collision sound, the user perceives the click feeling and the click sound.

Fourth Embodiment

The fourth embodiment is different from the first embodiment in that the magnetic field detection part 25 does not detect a change in the strength of the magnetic field due to the approach of the permanent magnet 24 as a change in the magnetic field; instead, the magnetic field detection part 25 detects a change in the magnetic pole due to the movement of the permanent magnet 24 as a change in the magnetic field. In the following description, the same components as those in any one of the first embodiment to the third embodiment are denoted by the same reference numerals as those in the first embodiment to the third embodiment, and the first embodiment to the third embodiment are referred to, and the detailed description is omitted.

Figure 13:
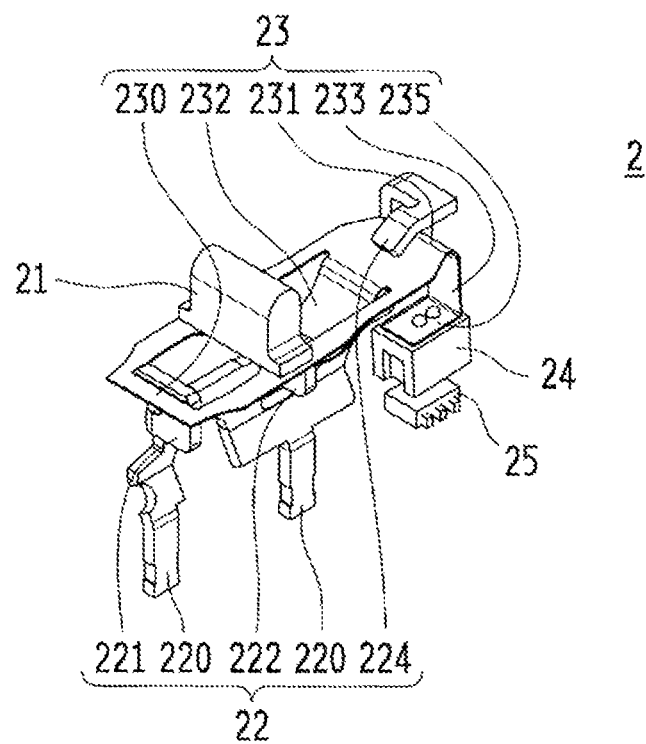
FIG. 13 is a schematic perspective view showing an example of the internal structure of the switch according to the disclosure.
Figure 14:
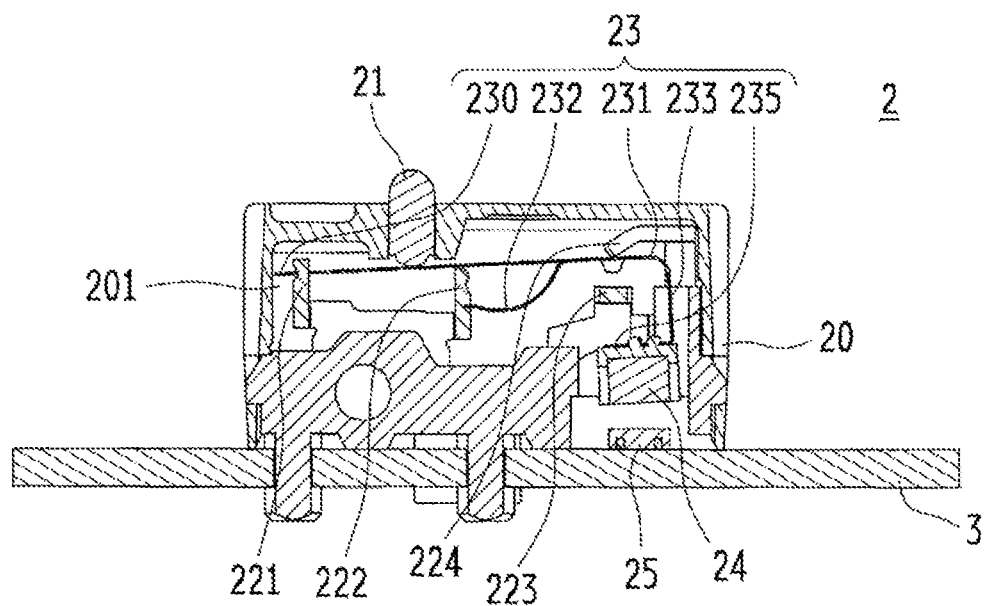
FIG. 14 is a schematic cross-sectional view showing an example of a cross section of the switch according to the disclosure.
Figure 15:
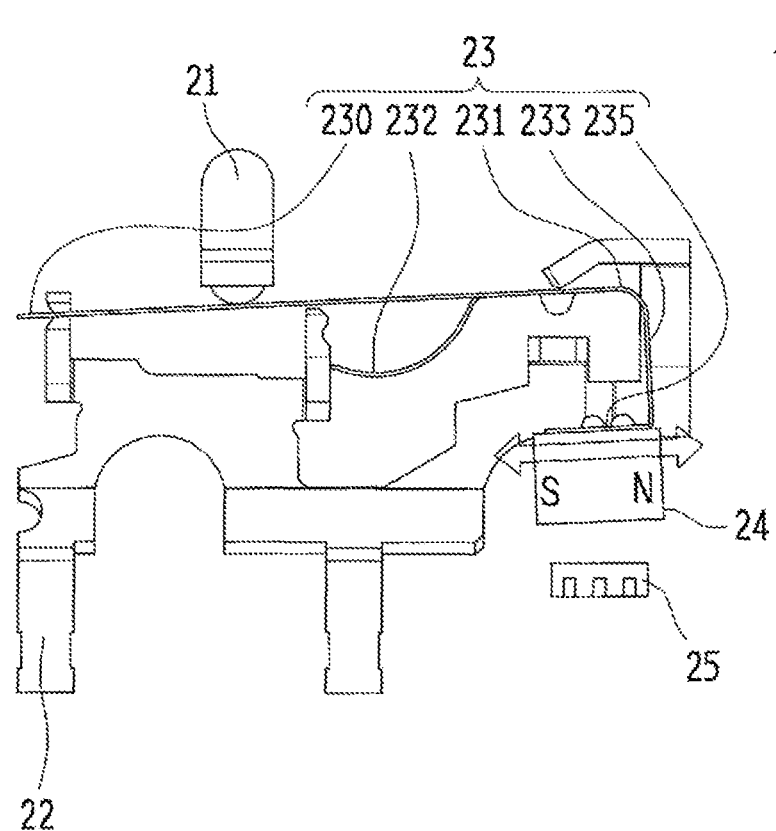
FIG. 15 is a schematic front view showing an example of the internal structure provided in the switch according to the disclosure.

FIG. 13 is a schematic perspective view showing an example of the internal structure of the switch 2 according to the disclosure. FIG. 14 is a schematic cross-sectional view showing an example of a cross section of the switch 2 according to the disclosure. FIG. 15 is a schematic front view showing an example of the internal structure provided in the switch 2 according to the disclosure. FIG. 13 is a schematic perspective view showing internal members by removing the housing 20 from the switch 2. FIG. 15 is a schematic front view showing internal members by removing the housing 20 from the switch 2, and schematically shows the operation direction and the magnetic poles of the permanent magnet 24 in a superimposed manner.

In the switch 2 according to the fourth embodiment, the movable member 23 includes the bent piece 233 that is bent at a substantially right angle on the second end 231 side and extends downward, and the tip of the bent piece 233 further includes a bent attachment part 235 bent at a substantially right angle. The permanent magnet 24 is attached to the bent attachment part 235 which is the tip of the movable member 23 on the second end 231 side. As shown in FIG. 15, the permanent magnet 24 attached to the bent attachment part 235 is disposed so that the S pole and the N pole are arranged in the left-right direction. Since the movable member 23 swings when receiving the pressing of the pressing member 21, the bent attachment part 235 moves in an arc shape due to the swing with respect to the magnetic field detection part 25 located below the bent piece 233. The arc-shaped movement has a movement component in the left-right direction. That is, the permanent magnet 24 attached to the bent attachment part 235 of the movable member 23 performs a movement including a component in the left-right direction substantially orthogonal to the up-down direction that is the bending direction of the bent piece 233 of the movable member 23. In FIG. 15, the movement including the component in the left-right direction is indicated by an arrow. As the permanent magnet 24 in which the S pole and the N pole are disposed in the left-right direction is moved in the left-right direction, the magnetic field detection part 25 located below the bent attachment part 235 detects a change in the magnetic poles that generate the magnetic field to be detected since the nearest magnetic pole of the permanent magnet 24 changes. That is, the permanent magnet 24 attached to the bent attachment part 235 of the movable member 23 on the second end 231 side moves in a direction substantially orthogonal to the bending direction of the bent piece 233 bent toward the magnetic field detection part 25. As a result, the direction of the magnetic field detected by the magnetic field detection part 25 changes.

In the switch 2 according to the fourth embodiment, it is preferable to use an alternating detection type Hall element that detects a change in the pole related to the magnetic flux in the magnetic field detection part 25. Since the alternating detection type Hall element has a high detection sensitivity, a change in the magnetic field to be detected can be detected with high accuracy, and the reliability of switching can be increased.

Figure 16A:
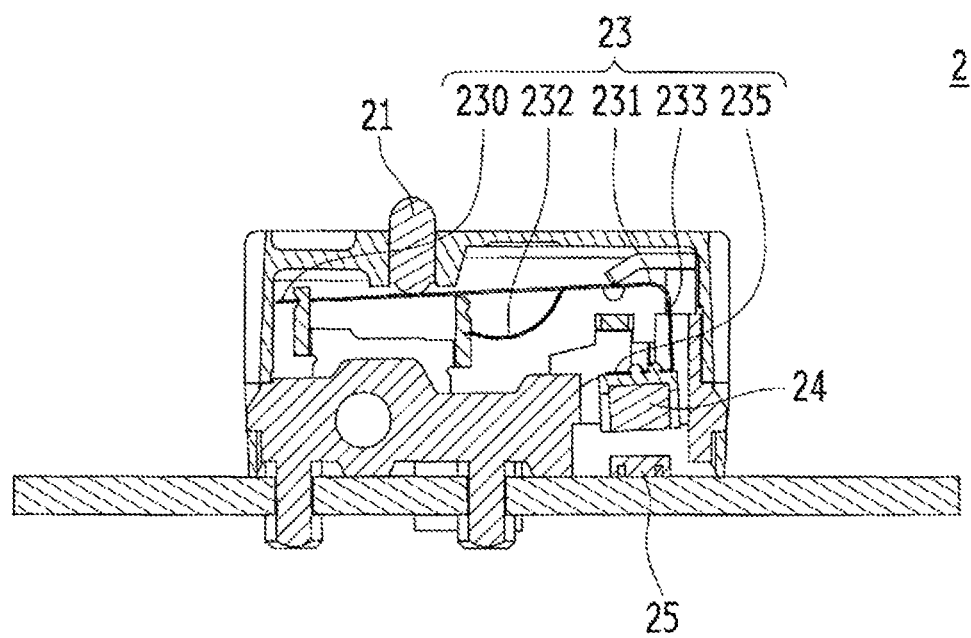
FIG. 16A is a schematic cross-sectional view showing an example of the switch according to the disclosure.
Figure 16B:
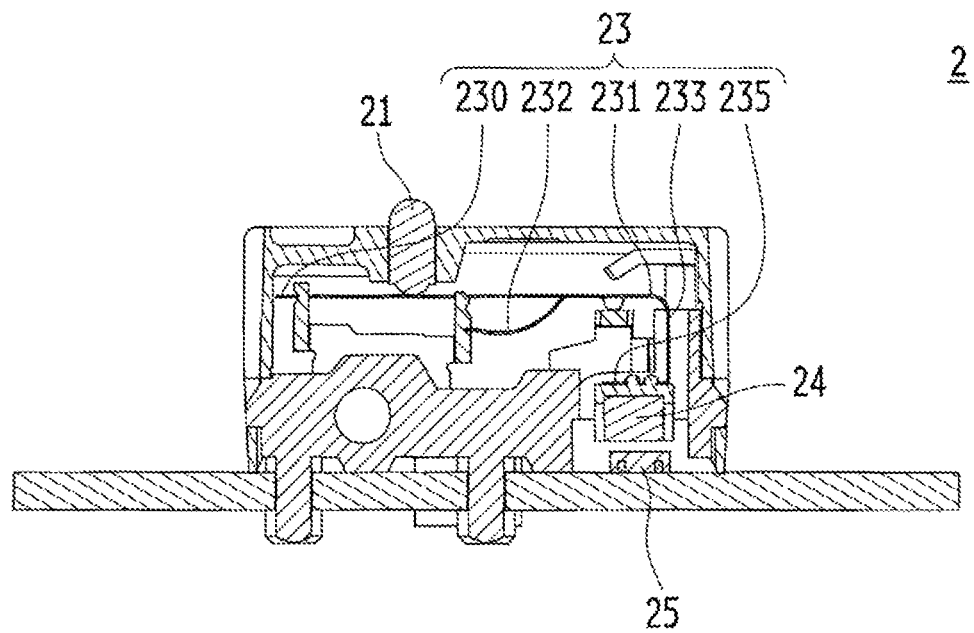
FIG. 16B is a schematic cross-sectional view showing an example of the switch according to the disclosure.

Next, the operation of the switch 2 according to the disclosure will be described. FIG. 16A and FIG. 16B are schematic cross-sectional views showing an example of the switch 2 according to the disclosure. FIG. 16A shows a state where the pressing member 21 does not receive a pressing from the outside, and FIG. 16B shows a state where the pressing member 21 receives a pressing from the outside and moves downward.

When the pressing member 21 moves downward and presses the movable member 23 downward, the second end 231 side of the movable member 23 swings downward, and the movable member 23 contra-rotates and contacts the first contact part 223. Since the movable member 23 collides with the first contact part 223 with the force of the contra-rotation, the user perceives the change in the sound and the pressing load caused by the impact due to the contra-rotation and the collision as the click sound and the click feeling.

Further, as illustrated in FIG. 16A, when the pressing member 21 does not receive a pressing from the outside, since the permanent magnet 24 attached to the bent attachment part 235 which is the tip of the bent piece 233 of the movable member 23 is located on the right side, the magnetic field detection part 25 detects the magnetic field of the S pole on the left end side of the permanent magnet 24.

Further, as illustrated in FIG. 16B, when the pressing member 21 receives a pressing from the outside, since the permanent magnet 24 attached to the bent attachment part 235 of the movable member 23 moves leftward and is located on the left side, the magnetic field detection part 25 detects the magnetic field of the N pole on the right end side of the permanent magnet 24. The change of the magnetic field detected by the magnetic field detection part 25 is output by the magnetic field detection part 25 as an internal signal, and is output by the switch 2 to the operation device 1 as an ON signal.

As described above, in the switch 2 according to the disclosure, the movable member 23 moves with respect to the magnetic field detection part 25 due to the swing of the movable member 23 caused by the pressing of the pressing member 21 so that the near magnetic pole of the permanent magnet 24 located on the second end 231 side changes. As different magnetic poles approach the magnetic field detection part 25, the magnetic field detected by the magnetic field detection part 25 changes. In particular, by using a magnetic field detection part 25 with an alternating detection type Hall element as the magnetic field detection part 25, the reliability of switching can be increased. In addition, when the magnetic field detected by the magnetic field detection part 25 changes, the switch 2 outputs an ON signal. Further, since the swing of the movable member 23 involves a change in the pressing load and the generation of a collision sound, the user perceives the click feeling and the click sound.

Fifth Embodiment

The fifth embodiment is different from the fourth embodiment in that the permanent magnet 24 is not attached to the movable member 23; instead, the second end 231 side of the movable member 23 is magnetized to be used as a magnet. In the following description, the same components as those in any one of the first embodiment to the fourth embodiment are denoted by the same reference numerals as those in the first embodiment to the fourth embodiment, and the first embodiment to the fourth embodiment are referred to, and the detailed description is omitted.

Figure 17:
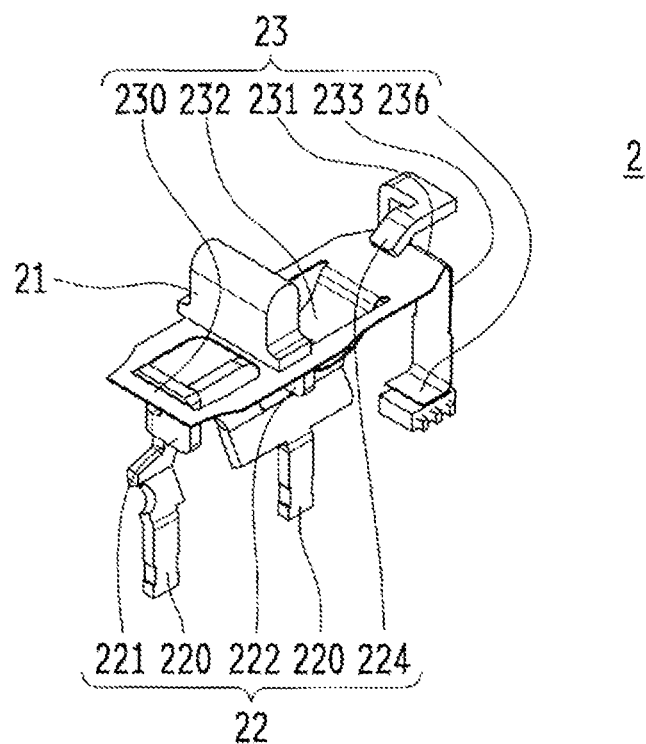
FIG. 17 is a schematic perspective view showing an example of the internal structure of the switch according to the disclosure.
Figure 18:
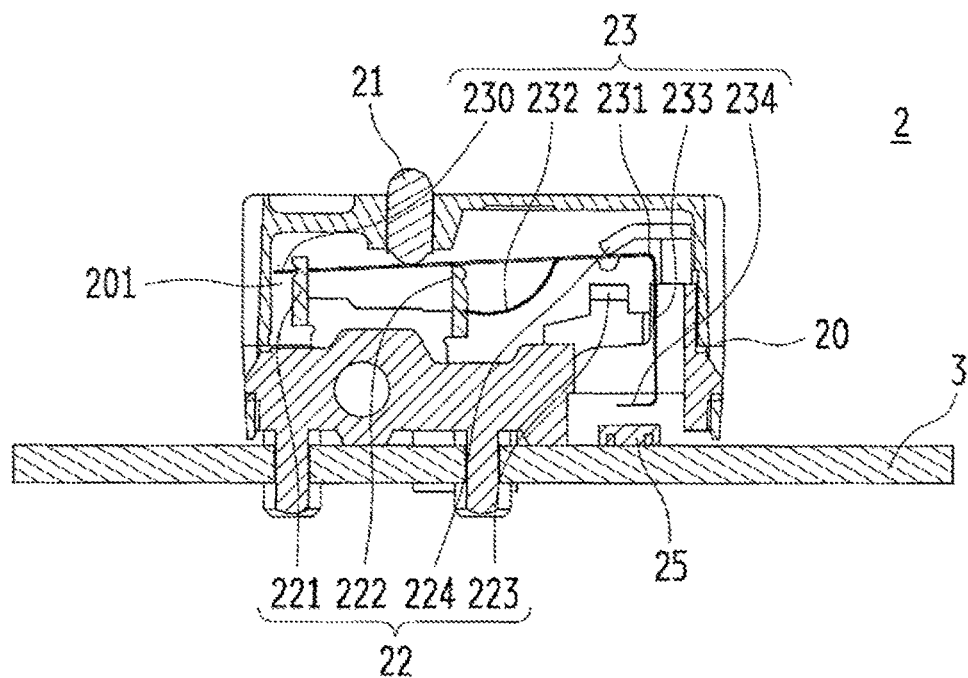
FIG. 18 is a schematic cross-sectional view showing an example of a cross section of the switch according to the disclosure.
Figure 19:
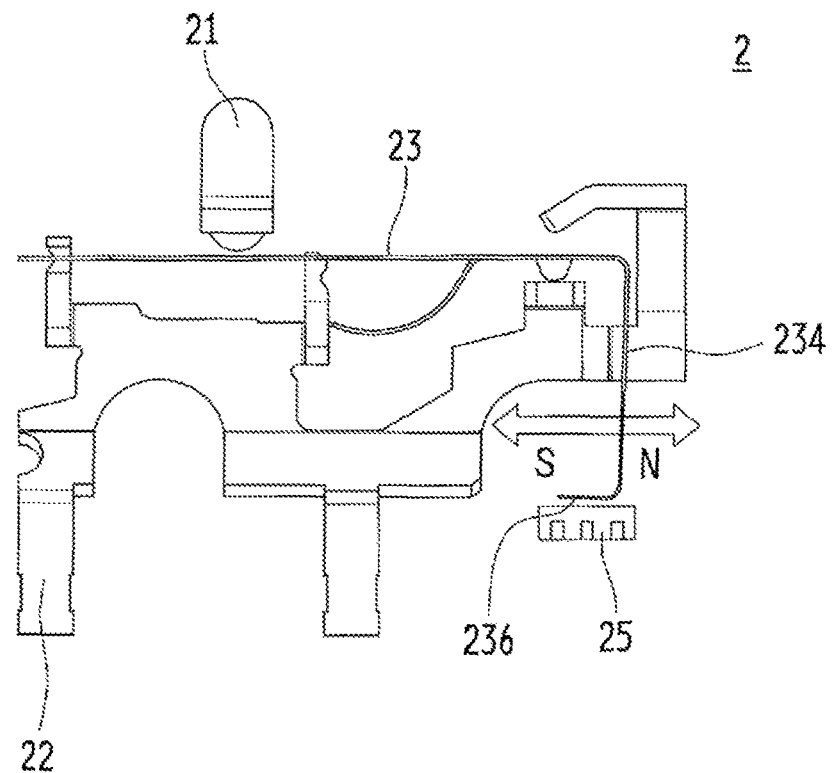
FIG. 19 is a schematic front view showing an example of the internal structure provided in the switch according to the disclosure.

FIG. 17 is a schematic perspective view showing an example of the internal structure of the switch 2 according to the disclosure. FIG. 18 is a schematic cross-sectional view showing an example of a cross section of the switch 2 according to the disclosure. FIG. 19 is a schematic front view showing an example of the internal structure provided in the switch 2 according to the disclosure. FIG. 17 is a schematic perspective view showing internal members by removing the housing 20 from the switch 2. FIG. 19 is a schematic front view showing internal members by removing the housing 20 from the switch 2, and schematically shows the operation direction and the magnetic poles of a bent magnetized part 236 in a superimposed manner.

In the switch 2 according to the fifth embodiment, the movable member 23 includes the bent piece 233 that is bent at a substantially right angle on the second end 231 side and extends downward, and the tip of the bent piece 233 further includes a bent magnetized part 236 bent at a substantially right angle. The movable member 23 is formed by a non-magnetic material such as austenitic stainless steel, but the tip part of the bent piece 233 on the second end 231 side is the bent magnetized part 236 (magnet) that is partially magnetized. The bent magnetized part 236 is formed, for example, by cold working only the tip part of the bent piece 233 of the movable member 23 formed by austenitic stainless steel, so that the cold worked tip part is magnetized by being transformed into martensite of a magnetic material. The bent magnetized part 236 of the movable member 23 formed by magnetization extends from above the magnetic field detection part 25 to the magnetic field detection part 25 below and functions as a magnet for generating a magnetic field detected by the magnetic field detection part 25.

Further, as shown in FIG. 19, the bent magnetized part 236 which is the tip part of the bent piece 233 of the movable member 23 is magnetized so that the S pole and the N pole are arranged in the left-right direction. Since the movable member 23 swings when receiving the pressing of the pressing member 21, the bent magnetized part 236 performs a movement including a component in the left-right direction substantially orthogonal to the up-down direction that is the bending direction of the bent piece 233 of the movable member 23. In FIG. 19, the movement including the component in the left-right direction is indicated by an arrow. As the bent magnetized part 236 magnetized in a way in which the S pole and the N pole are arranged in the left-right direction is moved in the left-right direction, the magnetic field detection part 25 located below the bent magnetized part 236 detects a change in the magnetic poles. That is, the bent magnetized part 236 of the movable member 23 on the second end 231 side moves in a direction substantially orthogonal to the bending direction of the bent piece 233 bent toward the magnetic field detection part 25. As a result, the direction of the magnetic field detected by the magnetic field detection part 25 changes.

In the switch 2 according to the fifth embodiment, it is preferable to use an alternating detection type Hall element in the magnetic field detection part 25.

Figure 20A:
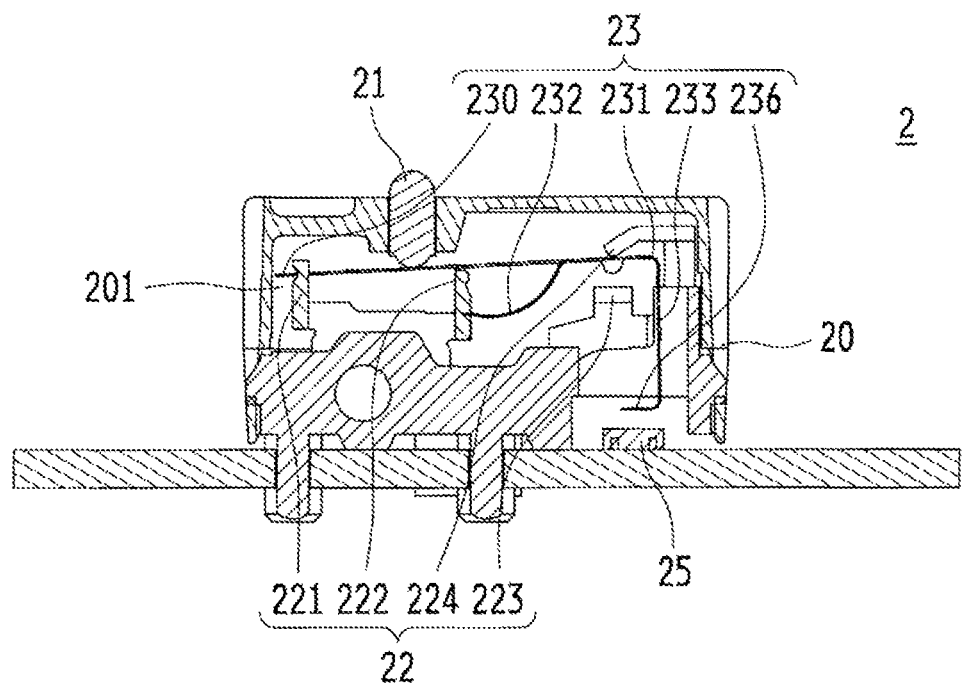
FIG. 20A is a schematic cross-sectional view showing an example of the switch according to the disclosure.
Figure 20B:
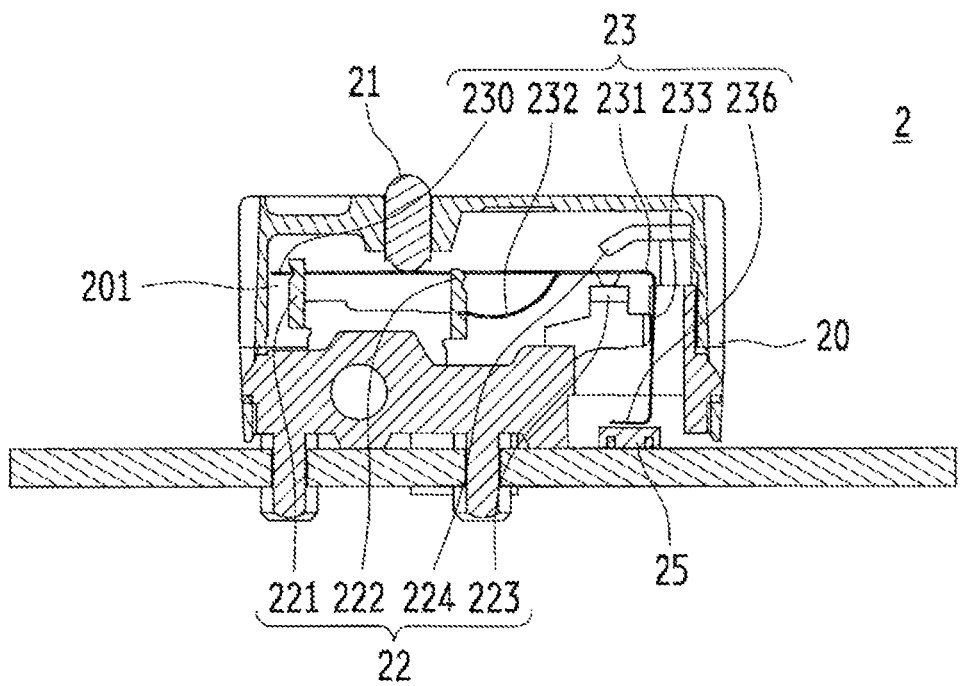
FIG. 20B is a schematic cross-sectional view showing an example of the switch according to the disclosure.

Next, the operation of the switch 2 according to the disclosure will be described. FIG. 20A and FIG. 20B are schematic cross-sectional views showing an example of the switch 2 according to the disclosure. FIG. 20A shows a state where the pressing member 21 does not receive a pressing from the outside, and FIG. 20B shows a state where the pressing member 21 receives a pressing from the outside and moves downward.

When the pressing member 21 moves downward and presses the movable member 23 downward, the second end 231 side of the movable member 23 swings downward, and the movable member 23 contra-rotates and contacts the first contact part 223. Since the movable member 23 collides with the first contact part 223 with the force of the contra-rotation, the user perceives the change in the sound and the pressing load caused by the impact due to the contra-rotation and the collision as the click sound and the click feeling.

Further, as illustrated in FIG. 20A, when the pressing member 21 does not receive a pressing from the outside, since the bent magnetized part 236 which is the tip of the bent piece 233 of the movable member 23 is located on the right side, the magnetic field detection part 25 detects the magnetic field of the S pole on the left end side of the bent magnetized part 236.

As illustrated in FIG. 20B, when the pressing member 21 receives a pressing from the outside, since the bent magnetized part 236 of the movable member 23 moves leftward and is located on the left side, the magnetic field detection part 25 detects the magnetic field of the N pole on the right end side of the bent magnetized part 236. The change of the magnetic field detected by the magnetic field detection part 25 is output by the magnetic field detection part 25 as an internal signal, and is output by the switch 2 to the operation device 1 as an ON signal.

As described above, in the switch 2 according to the disclosure, the movable member 23 moves with respect to the magnetic field detection part 25 due to the swing of the movable member 23 caused by the pressing of the pressing member 21 so that the near magnetic pole of the bent magnetized part 236 located on the second end 231 side changes. As different magnetic poles approach the magnetic field detection part 25, the magnetic field detected by the magnetic field detection part 25 changes. In particular, by using a magnetic field detection part 25 with an alternating detection type Hall element as the magnetic field detection part 25, the reliability of switching can be increased. In addition, when the magnetic field detected by the magnetic field detection part 25 changes, the switch 2 outputs an ON signal. Further, since the swing of the movable member 23 involves a change in the pressing load and the generation of a collision sound, the user perceives the click feeling and the click sound.

Sixth Embodiment

The sixth embodiment is different from the first embodiment in that the magnet is not integrated with the movable member 23; instead, the magnet is disposed as a separate member from the movable member 23. In the following description, the same components as those in any one of the first embodiment to the fifth embodiment are denoted by the same reference numerals as those in the first embodiment to the fifth embodiment, and the first embodiment to the fifth embodiment are referred to, and the detailed description is omitted.

Figure 21:
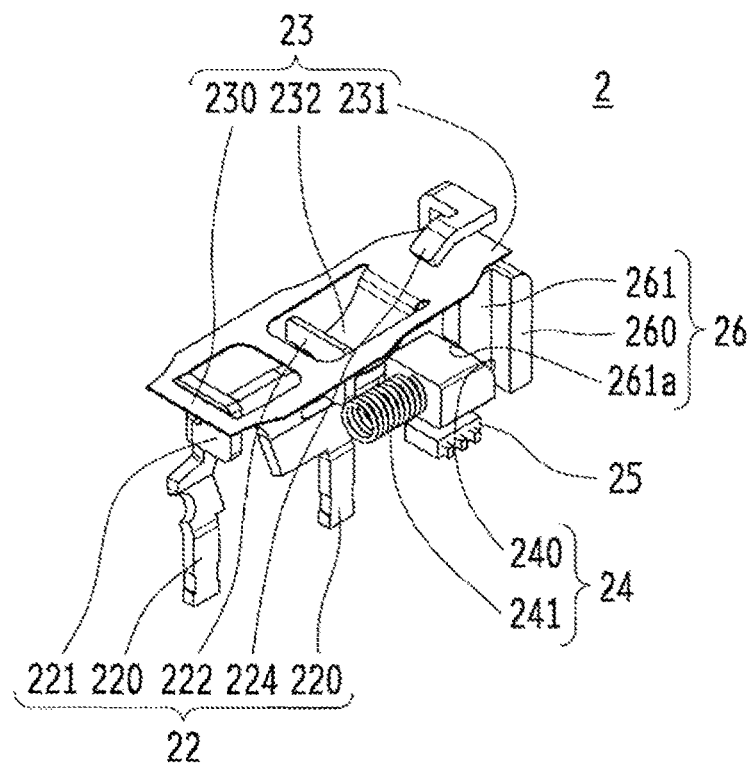
FIG. 21 is a schematic perspective view showing an example of the internal structure of the switch according to the disclosure.
Figure 22:
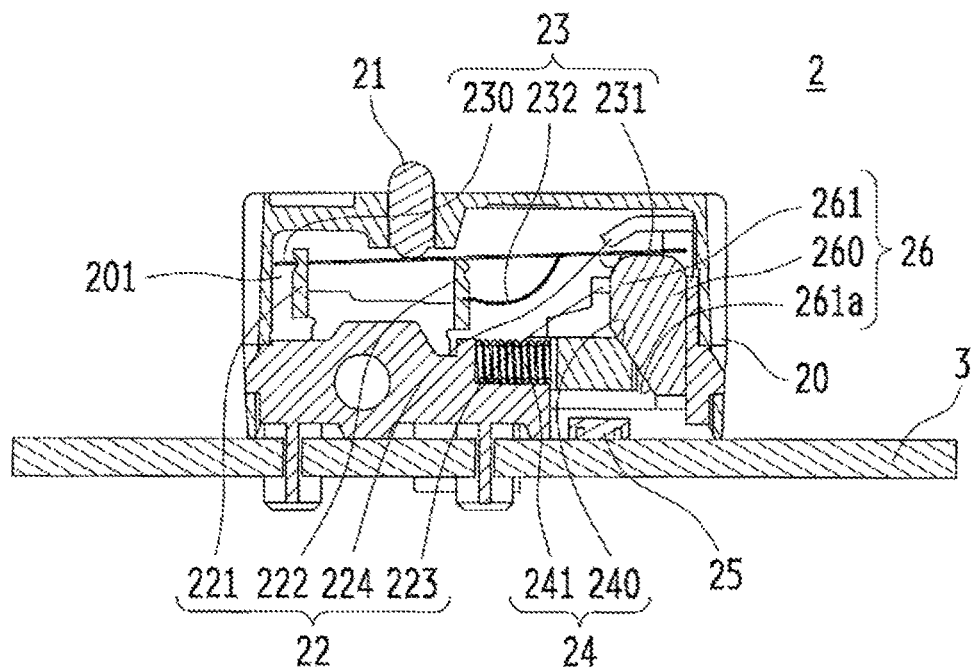
FIG. 22 is a schematic cross-sectional view showing an example of a cross section of the switch according to the disclosure.
Figure 23:
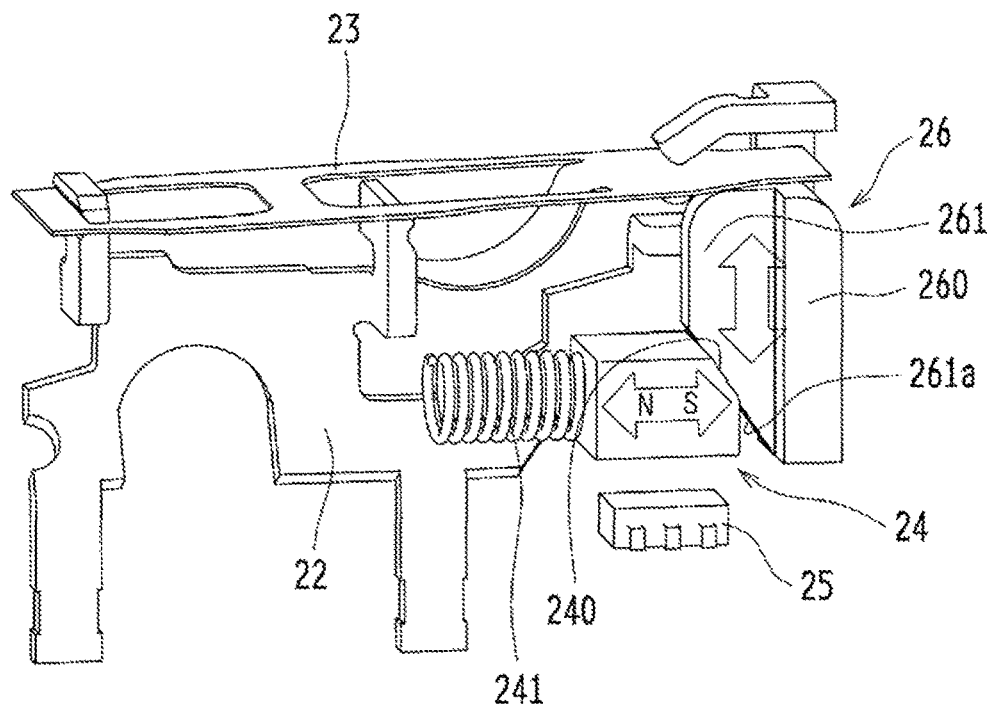
FIG. 23 is a schematic perspective view showing an example of the internal structure of the switch according to the disclosure.

FIG. 21 is a schematic perspective view showing an example of the internal structure of the switch 2 according to the disclosure. FIG. 22 is a schematic cross-sectional view showing an example of a cross section of the switch 2 according to the disclosure. FIG. 23 is a schematic perspective view showing an example of the internal structure of the switch 2 according to the disclosure. FIG. 21 is a schematic perspective view showing internal members by removing the housing 20 and the pressing member 21 from the switch 2. FIG. 23 is a schematic perspective view in which the housing 20 is removed from the switch 2, and schematically shows arrows indicating the operation directions of various members and magnetic poles in a superimposed manner.

The switch 2 according to the sixth embodiment includes a plunger 26 (pusher) that is pressed by the swing of the movable member 23 and moves downward. The plunger 26 presses the permanent magnet 24 by the movement caused by the pressing of the movable member 23. In the switch 2 according to the sixth embodiment, since the movable member 23 does not include the bent piece 233 on the second end 231 side, the movable member 23 is formed in a substantially flat plate shape except for the urging part 232. The plunger 26 is disposed below the movable member 23 on the second end 231 side to be movable up and down. Further, in FIG. 23, the movement direction of the plunger 26 is indicated by a white double-headed arrow.

The plunger 26 has a shape in which a pressing part 261 protrudes from a side surface of a main body 260 having a substantially rectangular parallelepiped shape. The pressing part 261 is formed to protrude in the left direction of the figure from the main body 260, and the pressing part 261 has a pressing surface 261a that is tapered from the vicinity of the center in the up-down direction to the lower end.

The permanent magnet 24 is disposed on the left side of the plunger 26 where the pressing part 261 protrudes to contact the pressing surface 261a of the plunger 26 and to be movable left and right. The permanent magnet 24 has a substantially rectangular parallelepiped shape, and is disposed so that the long side direction is the left-right direction and the left and right ends thereof are the N pole and the S pole, respectively. Further, in FIG. 23, the magnetic poles and the movement direction of the permanent magnets 24 are indicated by a white double-headed arrow in a superimposed manner. A pressed surface 240 is formed on the upper surface of the permanent magnet 24, and the pressed surface 240 is tapered from a position to the right of the center to the right end. The permanent magnet 24 is disposed so that the pressed surface 240 contacts the pressing surface 261a of the plunger 26. An urging member 241 such as a compression coil spring is attached to the left side of the permanent magnet 24 as a return spring that urges the permanent magnet 24 rightward to move toward the plunger 26 side, and the left end side of the urging member 241 is attached to the inside of the housing 20.

The magnetic field detection part 25 is disposed below the permanent magnet 24. It is preferable that the magnetic field detection part 25 is configured with an alternating detection type Hall element. As the permanent magnet 24 moves left and right, different magnetic poles approach the magnetic field detection part 25, and the magnetic field detected by the magnetic field detection part 25 changes.

Figure 24A:
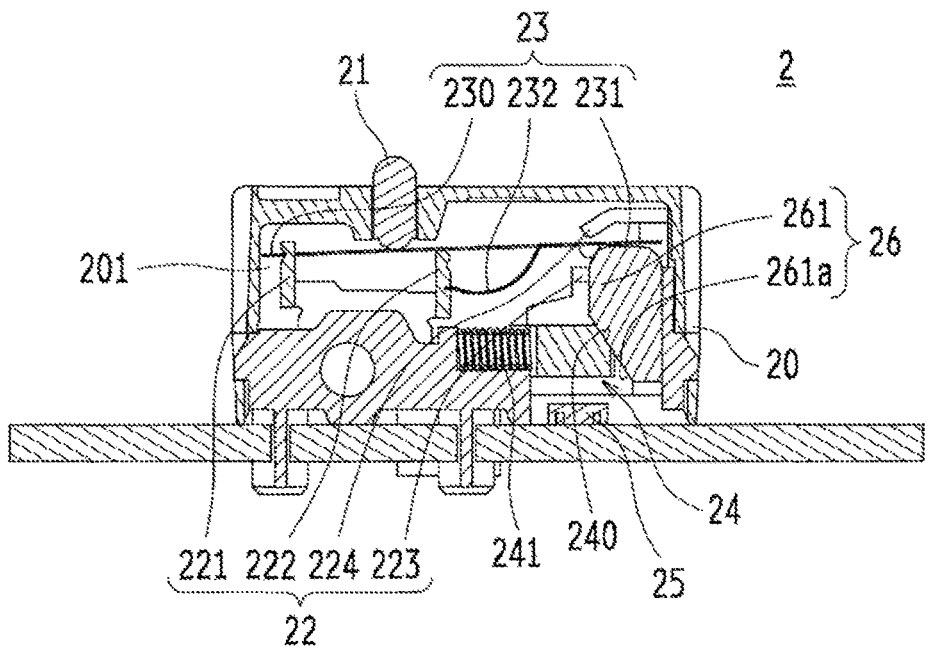
FIG. 24A is a schematic cross-sectional view showing an example of the switch according to the disclosure.
Figure 24B:
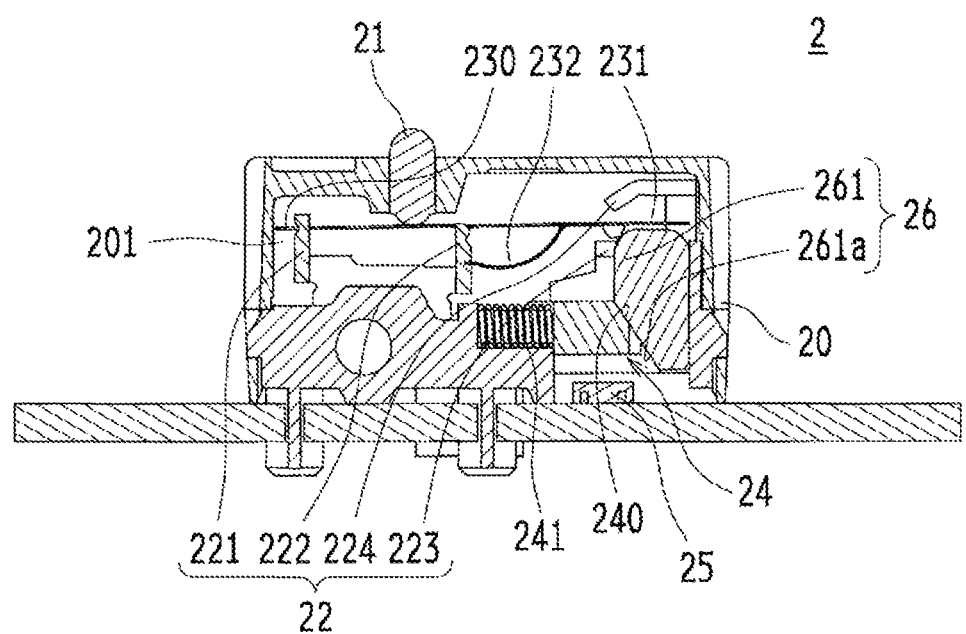
FIG. 24B is a schematic cross-sectional view showing an example of the switch according to the disclosure.

Next, the operation of the switch 2 according to the disclosure will be described. FIG. 24A and FIG. 24B are schematic cross-sectional views showing an example of the switch 2 according to the disclosure. FIG. 24A shows a state where the pressing member 21 does not receive a pressing from the outside, and FIG. 24B shows a state where the pressing member 21 receives a pressing from the outside and moves downward.

When the pressing member 21 moves downward and presses the movable member 23 downward, the second end 231 side of the movable member 23 swings downward, and the movable member 23 contra-rotates and contacts the first contact part 223. Since the movable member 23 collides with the first contact part 223 with the force of the contra-rotation, the user perceives the change in the sound and the pressing load caused by the impact due to the contra-rotation and the collision as the click sound and the click feeling.

Further, as illustrated in FIG. 24A, when the pressing member 21 does not receive a pressing from the outside, the second end 231 of the movable member 23 is located above. Since the permanent magnet 24 is urged rightward by the urging member 241, the permanent magnet 24 is located on the right side, and the magnetic field detection part 25 detects the magnetic field of the N pole on the left end side of the permanent magnet 24. When the permanent magnet 24 is located on the right side, the plunger 26 contacting the pressed surface 240 of the permanent magnet 24 on the pressing surface 261a is pushed upward.

As illustrated in FIG. 24B, when the pressing member 21 receives a pressing from the outside, the second end 231 of the movable member 23 moves downward and presses the plunger 26 downward. The plunger 26 pressed by the movable member 23 moves downward. When the plunger 26 moves downward, the pressing surface 261a formed on the pressing part 261 of the plunger 26 slides while pressing the pressed surface 240 of the permanent magnet 24, and the permanent magnet 24 operates as a cam slider that is driven by the movement of the plunger 26 that operates as a cam driver. Since the operation direction of the permanent magnet 24 operating as a cam slider is restricted in the left-right direction, the permanent magnet 24 operates to move in the left direction. That is, by the slide cam mechanism formed by the plunger 26 and the permanent magnet 24 in cooperation, the permanent magnet 24 moves in the left-right direction different from the up-down direction which is the movement direction of the plunger 26; more specifically, the permanent magnet 24 moves in the left-right direction that is substantially orthogonal to the lower part of the movement direction of the plunger 26. As shown in FIG. 24B, as the permanent magnet 24 is located on the left side, the magnetic field detection part 25 detects the magnetic field of the S pole on the right end side of the permanent magnet 24. The change of the magnetic field detected by the magnetic field detection part 25 is output by the magnetic field detection part 25 as an internal signal, and is output by the switch 2 to the operation device 1 as an ON signal.

As described above, in the switch 2 according to the disclosure, the movable member 23 presses the permanent magnet 24 via the plunger 26 with respect to the magnetic field detection part 25 by the swing of the movable member 23 caused by the pressing of the pressing member 21; accordingly, the permanent magnet 24 moves so that the magnetic pole near the magnetic field detection part 25 changes. As different magnetic poles approach the magnetic field detection part 25, the magnetic field detected by the magnetic field detection part 25 changes. In particular, by using a magnetic field detection part 25 with an alternating detection type Hall element as the magnetic field detection part 25, the reliability of switching can be increased. In addition, when the magnetic field detected by the magnetic field detection part 25 changes, the switch 2 outputs an ON signal. Further, since the swing of the movable member 23 involves a change in the pressing load and the generation of a collision sound, the user perceives the click feeling and the click sound.

Seventh Embodiment

The seventh embodiment is different from the sixth embodiment in that an operation caused by the plunger 26 pressing another member is different. In the following description, the same components as those in any one of the first embodiment to the sixth embodiment are denoted by the same reference numerals as those in the first embodiment to the sixth embodiment, and the first embodiment to the sixth embodiment are referred to, and the detailed description is omitted.

Figure 25:
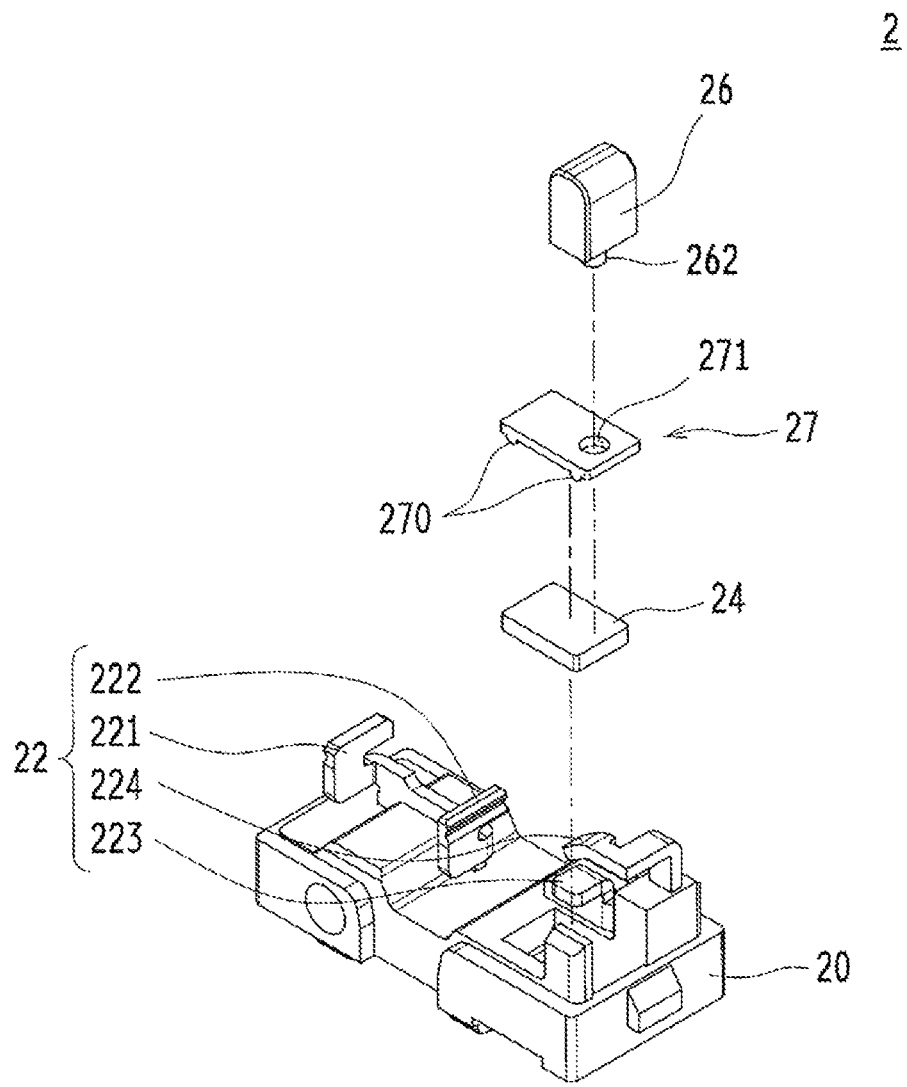
FIG. 25 is a schematic exploded perspective view showing an example of the switch according to the disclosure.
Figure 26:
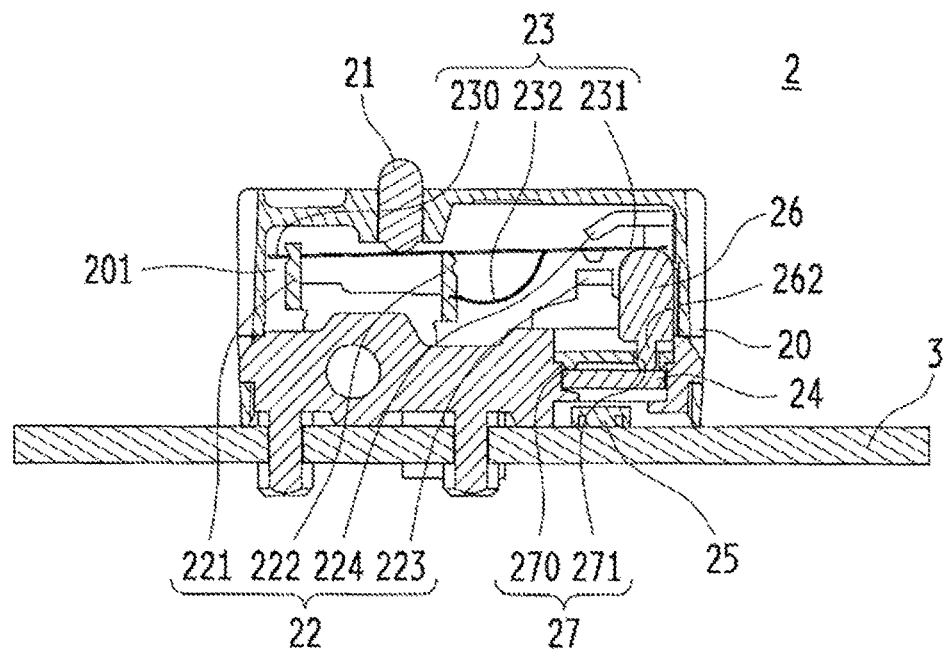
FIG. 26 is a schematic cross-sectional view showing an example of the internal structure of the switch according to the disclosure.

FIG. 25 is a schematic exploded perspective view showing an example of the switch 2 according to the disclosure. FIG. 26 is a schematic perspective view showing an example of the internal structure of the switch 2 according to the disclosure. FIG. 25 omits the cover 20b and the movable member 23 of the housing 20.

The switch 2 according to the seventh embodiment includes a plunger 26 that is pressed by the swing of the movable member 23 and moves downward. The plunger 26 presses downward the permanent magnet 24 disposed below by the movement caused by the pressing of the movable member 23. The permanent magnet 24 swings downward due to the pressing by the plunger 26, and the magnetic field detection part 25 disposed below the permanent magnet 24 detects a change in the magnetic field caused by the swing of the permanent magnet 24.

The plunger 26 disposed below the movable member 23 has a substantially rectangular parallelepiped shape, and a pressing protrusion 262 in a circular columnar shape for pressing the permanent magnet 24 is disposed on its lower end in a protruding manner. The permanent magnet 24 disposed below the movable member 23 has a flat and substantially rectangular parallelepiped shape, and is disposed so that the long side direction is the left-right direction and the left and right ends thereof are the N pole and the S pole, respectively. In addition, the left end side of the permanent magnet 24 where one pole is located is disposed to be swingably and pivotally supported, and the right end side where the other pole is located is disposed to be swingable downward with the left end side as the swing axis.

A magnetic plate 27 is disposed above the permanent magnet 24 as a connection member that can be magnetically connected to the two poles located at the two ends of the permanent magnet 24. The magnetic plate 27 is formed by a paramagnetic material such as SPCC, and has a flat and substantially rectangular parallelepiped shape having substantially the same shape as the permanent magnet 24. Contact protrusions 270 are disposed at the left and right ends in the long side direction on the lower surface of the magnetic plate 27 to protrude downward, and the contact protrusions 270 contact the two poles of the left and right ends of the permanent magnet 24. Further, a through hole 271 through which the pressing protrusion 262 of the plunger 26 moving up and down can penetrate with clearance is disposed in the vicinity of the right end of the magnetic plate 27. When the plunger 26 pressed by the swing of the movable member 23 moves downward, the pressing protrusion 262 protruding from the lower end of the plunger 26 passes through the through hole 271 of the magnetic plate 27 and presses the vicinity of the right end of the permanent magnet 24 located below the magnetic plate 27.

When not pressed by the plunger 26, the two poles of the permanent magnet 24 are in contact with the contact protrusions 270 of the magnetic plate 27 by the magnetic force. When the magnetic plate 27 is magnetically connected to the two poles of the permanent magnet 24 by contact or the like, a closed magnetic circuit is formed by the permanent magnet 24 and the magnetic plate 27. When a closed magnetic circuit is formed, the magnetic flux caused by the permanent magnet 24 passes through the permanent magnet 24 and the magnetic plate 27 and does not form a magnetic field that is sufficiently detectable by the magnetic field detection part 25 disposed below the permanent magnet 24. When the pressing protrusion 262 protruding from the lower end of the plunger 26 penetrates the through hole 271 of the magnetic plate 27 and presses the permanent magnet 24, the permanent magnet 24 swings downward with the left end side as the swing axis. As the permanent magnet 24 swings downward, the permanent magnet 24 moves away from the magnetic plate 27, and the magnetic circuit is opened. As a result, the magnetic flux caused by the permanent magnet 24 form a magnetic field that is sufficiently detectable by the magnetic field detection part 25.

As described above, the switch 2 according to the seventh embodiment includes the magnetic plate 27 as a connection member that can be magnetically connected to the two poles of the permanent magnet 24. The permanent magnet 24 and the magnetic plate 27 are disposed so that the permanent magnet 24 can be moved toward and away from the magnetic plate 27 by swinging. In the case where the permanent magnet 24 moves away from the magnetic plate 27, the magnetic field generated by the permanent magnet 24 is detected by the magnetic field detection part 25. The plunger 26 moves due to the pressing by the movable member 23 so as to magnetically separate the permanent magnet 24 from the magnetic plate 27.

Figure 27A:
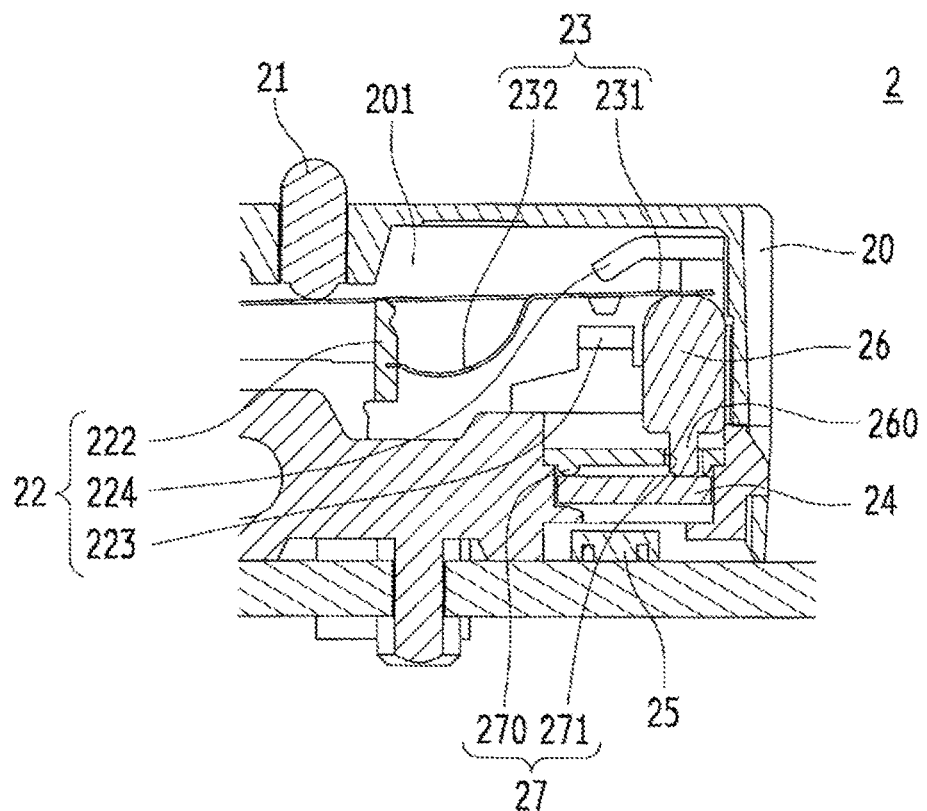
FIG. 27A is a schematic cross-sectional view showing an example of the switch according to the disclosure.
Figure 27B:
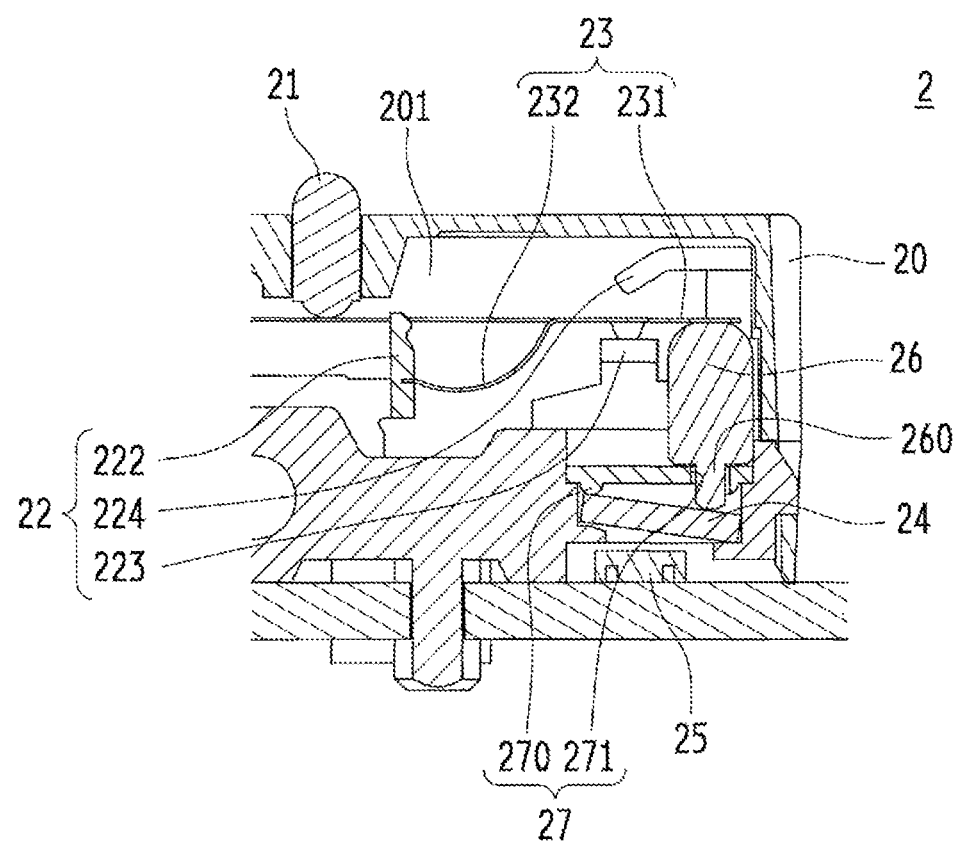
FIG. 27B is a schematic cross-sectional view showing an example of the switch according to the disclosure.

Next, the operation of the switch 2 according to the disclosure will be described. FIG. 27A and FIG. 27B are schematic cross-sectional views showing an example of the switch 2 according to the disclosure. FIG. 27A and FIG. 27B are enlarged views of the vicinity of the second end 231 of the movable member 23 in the switch 2. FIG. 27A shows a state where the pressing member 21 does not receive a pressing from the outside, and FIG. 27B shows a state where the pressing member 21 receives a pressing from the outside and moves downward.

When the pressing member 21 moves downward and presses the movable member 23 downward, the second end 231 side of the movable member 23 swings downward, and the movable member 23 contra-rotates and contacts the first contact part 223. Since the movable member 23 collides with the first contact part 223 with the force of the contra-rotation, the user perceives the change in the sound and the pressing load caused by the impact due to the contra-rotation and the collision as the click sound and the click feeling.

Further, as illustrated in FIG. 27A, when the pressing member 21 does not receive a pressing from the outside, the second end 231 of the movable member 23 is located above. When the movable member 23 is located above and the permanent magnet 24 does not receive the pressing of the plunger 26, the permanent magnet 24 attracts the magnetic plate 27 by the attraction based on the magnetic force, and thus swings upward to a position contacting the contact protrusions 270 of the magnetic plate 27. The upward swing of the permanent magnet 24 pushes the plunger 26 upward. When the permanent magnet 24 is in contact with the magnetic plate 27, a closed magnetic circuit is formed because the magnetic plate 27 is magnetically connected to the two poles of the permanent magnet 24. In a state where the closed magnetic circuit is formed, the magnetic field detection part 25 does not sufficiently detect the magnetic field generated by the permanent magnet 24.

As illustrated in FIG. 27B, when the pressing member 21 receives a pressing from the outside, the second end 231 of the movable member 23 moves downward and presses the plunger 26 downward. When the plunger 26 pressed by the movable member 23 moves downward, the pressing protrusion 262 of the plunger 26 passes through the through hole 271 of the magnetic plate 27 and presses the vicinity of the right end of the permanent magnet 24. The permanent magnet 24 pressed by the pressing protrusion 262 of the plunger 26 swings downward on the right end side with the left end side as the swing axis, and moves away from the magnetic plate 27 to open the closed magnetic circuit. When the magnetic circuit is opened, the magnetic field generated by the permanent magnet 24 is detected by the magnetic field detection part 25. The change of the magnetic field detected by the magnetic field detection part 25 is output by the magnetic field detection part 25 as an internal signal, and is output by the switch 2 to the operation device 1 as an ON signal.

As described above, in the switch 2 according to the disclosure, the movable member 23 presses the permanent magnet 24 via the plunger 26 by the swing of the movable member 23 caused by the pressing of the pressing member 21. The pressed permanent magnet 24 moves to open the closed magnetic circuit formed with the magnetic plate 27 so that the magnetic field detected by the magnetic field detection part 25 changes. In addition, when the magnetic field detected by the magnetic field detection part 25 changes, the switch 2 outputs an ON signal. Further, since the swing of the movable member 23 involves a change in the pressing load and the generation of a collision sound, the user perceives the click feeling and the click sound.

In addition, the permanent magnet 24 and the magnetic plate 27 may be configured in a way in which the magnetic plate 27 moves toward and away from the permanent magnet 24, or in a way in which the pressing of the plunger 26 closes the magnetic circuit.

Eighth Embodiment

The eighth embodiment is different from the first embodiment in that a contact mechanism other than the snap action mechanism is adopted. In the following description, the same components as those in any one of the first embodiment to the seventh embodiment are denoted by the same reference numerals as those in the first embodiment to the seventh embodiment, and the first embodiment to the seventh embodiment are referred to, and the detailed description is omitted.

Figure 28:
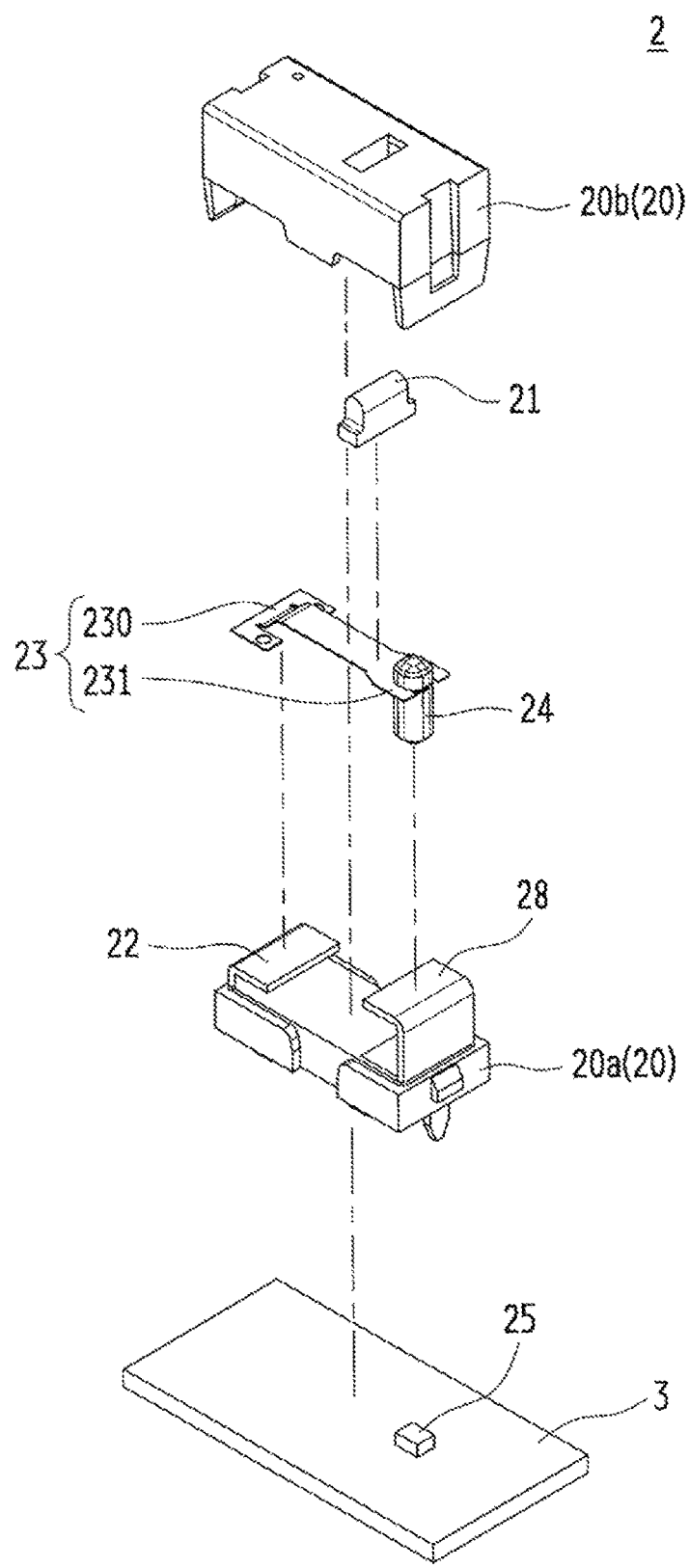
FIG. 28 is a schematic exploded perspective view showing an example of the switch according to the disclosure.
Figure 29:
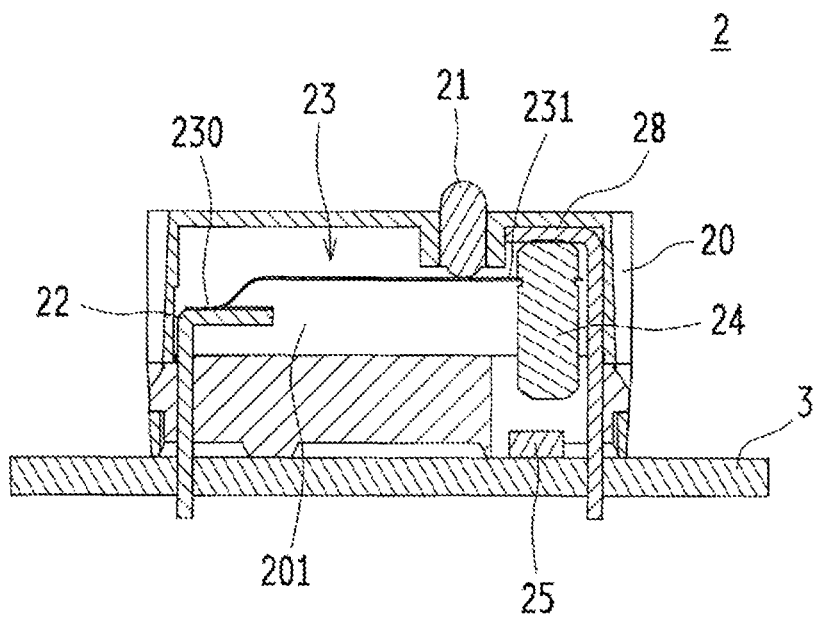
FIG. 29 is a schematic cross-sectional view showing an example of the internal structure of the switch according to the disclosure.

FIG. 28 is a schematic exploded perspective view showing an example of the switch 2 according to the disclosure. FIG. 29 is a schematic cross-sectional view showing an example of the internal structure of the switch 2 according to the disclosure.

The switch 2 according to the eighth embodiment includes, in the contact chamber 201, various members such as the locking member 22, the movable member 23, the permanent magnet 24, and an attraction member 28 as the contact mechanism, and the magnetic field detection part 25 is disposed at the lower right of the housing 20.

The locking member 22 according to the eighth embodiment is formed as a washer that fixes the first end 230 side of the movable member 23, and is fixed to the lower left in the contact chamber 201.

The movable member 23 according to the eighth embodiment is a flexible member formed by molding a thin metal plate into a leaf spring shape, and is fixed by the locking member 22 fixed as a washer at the lower left in the contact chamber 201 on the first end 230 side which serves as a fixed end. The movable member 23 is formed in a shape to extend obliquely upward to the right from the first end 230, is bent to be substantially horizontal in the middle, and extends rightward. The right end of the movable member 23 is the second end 231 that is a free end, and the permanent magnet 24 is attached to the second end 231.

The permanent magnet 24 is formed into a substantially circular columnar shape elongated in the axial direction by resin molding, and is attached to the movable member 23 so that the axial direction is the up-down direction. The magnetic field detection part 25 surface-mounted on the substrate 3 is disposed below the permanent magnet 24.

The attraction member 28 formed in an inverted L-shape is attached from the right side wall to the upper ceiling surface in the contact chamber 201. At least a part of the attraction member 28 located on the upper ceiling surface is formed by a magnetic material such as a paramagnetic material or a ferromagnetic material attracted by the magnetic force to the permanent magnet 24 attached to the second end 231 side of the movable member 23.

Figure 30A:
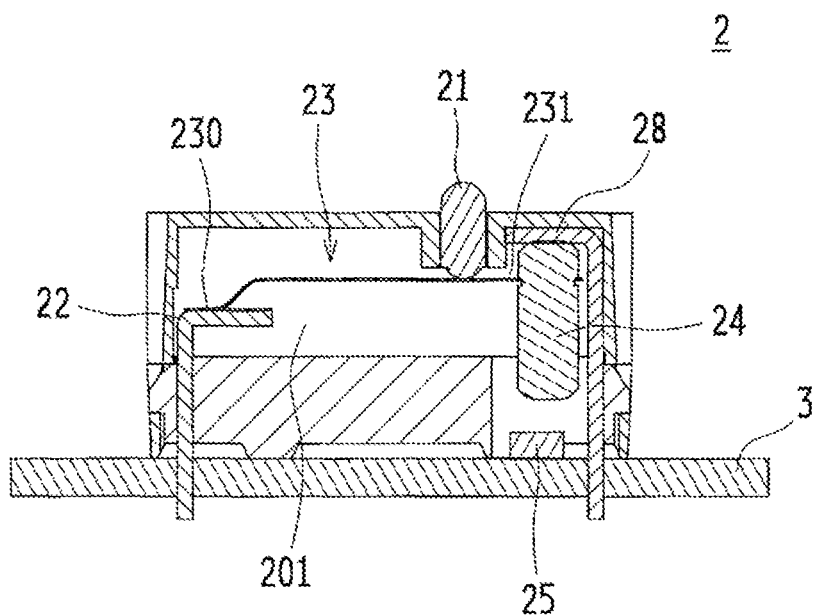
FIG. 30A is a schematic cross-sectional view showing an example of the switch according to the disclosure.
Figure 30B:
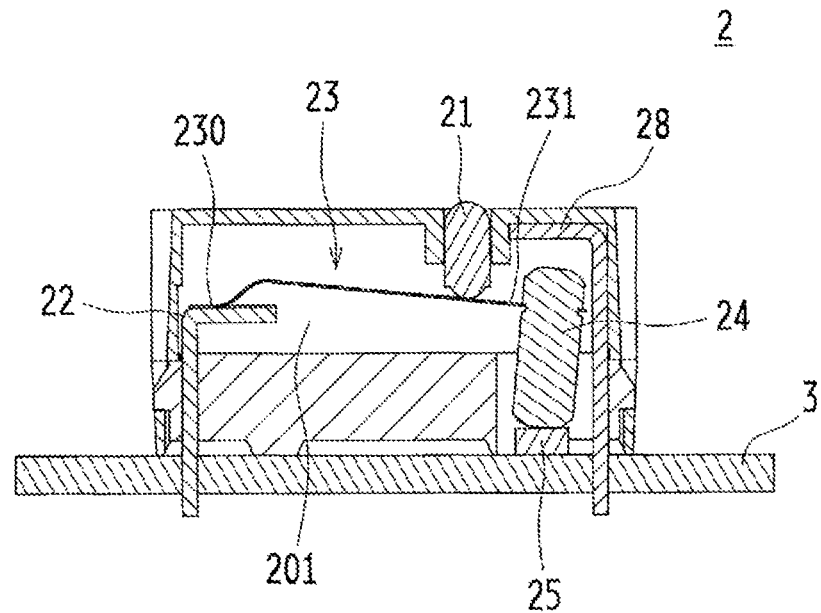
FIG. 30B is a schematic cross-sectional view showing an example of the switch according to the disclosure.

Next, the operation of the switch 2 according to the disclosure will be described. FIG. 30A and FIG. 30B are schematic cross-sectional views showing an example of the switch 2 according to the disclosure. FIG. 30A shows a state where the pressing member 21 does not receive a pressing from the outside, and FIG. 30B shows a state where the pressing member 21 receives a pressing from the outside and moves downward.

When the pressing member 21 moves downward and presses the movable member 23 downward, the second end 231 side of the movable member 23 swings downward. Since the downward swing of the movable member 23 is performed against the attraction based on the magnetic force between the permanent magnet 24 attached to the second end 231 side of the movable member 23 and the attraction member 28, the user perceives the force against the attraction as a click feeling.

Further, as illustrated in FIG. 30A, when the pressing member 21 does not receive a pressing from the outside, the second end 231 of the movable member 23 is located above, and the upper end of the permanent magnet 24 is attracted by the magnetic force to the upper ceiling surface of the attraction member 28 and is in contact therewith. In the state shown in FIG. 30A, the permanent magnet 24 is sufficiently upward and away from the magnetic field detection part 25.

As illustrated in FIG. 30B, when the pressing member 21 receives a pressing from the outside, the second end 231 of the movable member 23 swings downward, and the permanent magnet 24 attached to the second end 231 contacts or approaches the magnetic field detection part 25. As the permanent magnet 24 contacts or approaches the magnetic field detection part 25, the magnetic field detectable by the Hall element of the magnetic field detection part 25 changes. The change of the magnetic field detected by the Hall element is output by the magnetic field detection part 25 as an internal signal, and is output by the switch 2 to the operation device 1 as an ON signal.

As described above, in the switch 2 according to the disclosure, the permanent magnet 24 located on the second end 231 side of the movable member 23 approaches the magnetic field detection part 25 by the swing of the movable member 23 caused by the pressing of the pressing member 21. As the permanent magnet 24 approaches the magnetic field detection part 25, the magnetic field detected by the magnetic field detection part 25 changes. When the magnetic field detected by the magnetic field detection part 25 changes, the switch 2 outputs an ON signal. Further, when the movable member 23 swings, since a load of moving the permanent magnet 24 away from the attraction member 28 is generated, the user perceives the click feeling.

Ninth Embodiment

The ninth embodiment is different from the first embodiment in that the permanent magnet 24 is not attached to the movable member 23; instead, the permanent magnet 24 is attached to the pressing member 21. In the following description, the same components as those in any one of the first embodiment to the eighth embodiment are denoted by the same reference numerals as those in the first embodiment to the eighth embodiment, and the first embodiment to the eighth embodiment are referred to, and the detailed description is omitted.

Figure 31:
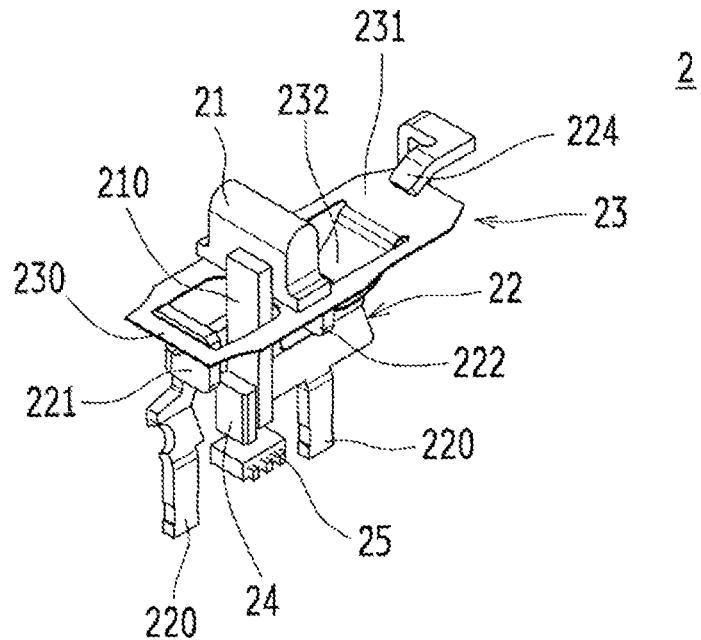
FIG. 31 is a schematic perspective view showing an example of the internal structure of the switch according to the disclosure.
Figure 32:
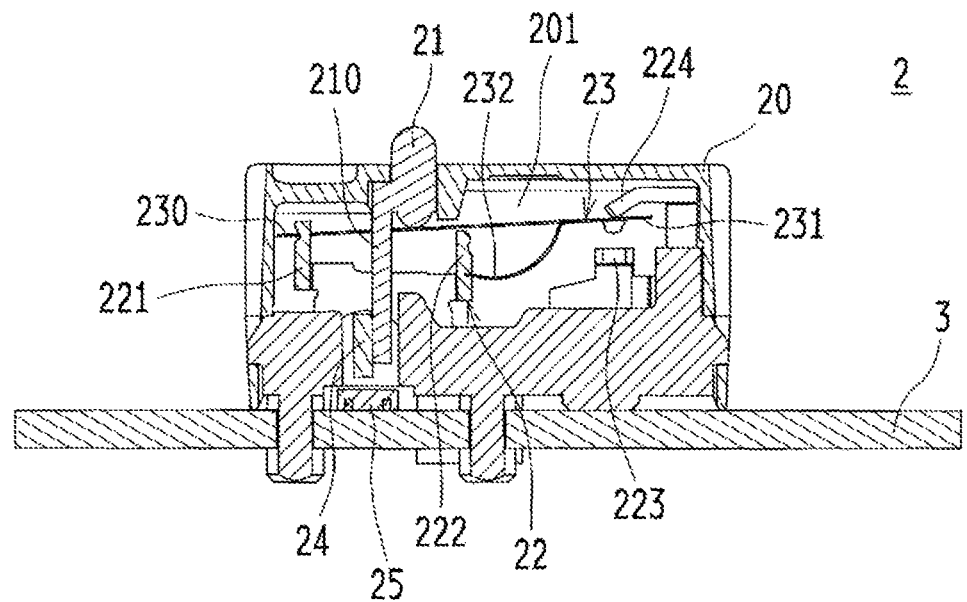
FIG. 32 is a schematic cross-sectional view showing an example of a cross section of the switch according to the disclosure.

FIG. 31 is a schematic perspective view showing an example of the internal structure of the switch 2 according to the disclosure. FIG. 32 is a schematic cross-sectional view showing an example of a cross section of the switch 2 according to the disclosure. FIG. 31 is a schematic perspective view showing internal members by removing the housing 20 from the switch 2.

In the switch 2 according to the ninth embodiment, a support body 210 in a long plate shape is formed on the side surface of the pressing member 21. The support body 210 extends downward from the side surface of the pressing member 21, and reaches an opening formed in the base 20*a* of the housing 20 through an opening formed in the movable member 23. The permanent magnet 24 is attached to the lower end of the support body 210 provided in the pressing member 21, and the magnetic field detection part 25 surface-mounted on the substrate 3 is disposed below the permanent magnet 24.

Figure 33A:
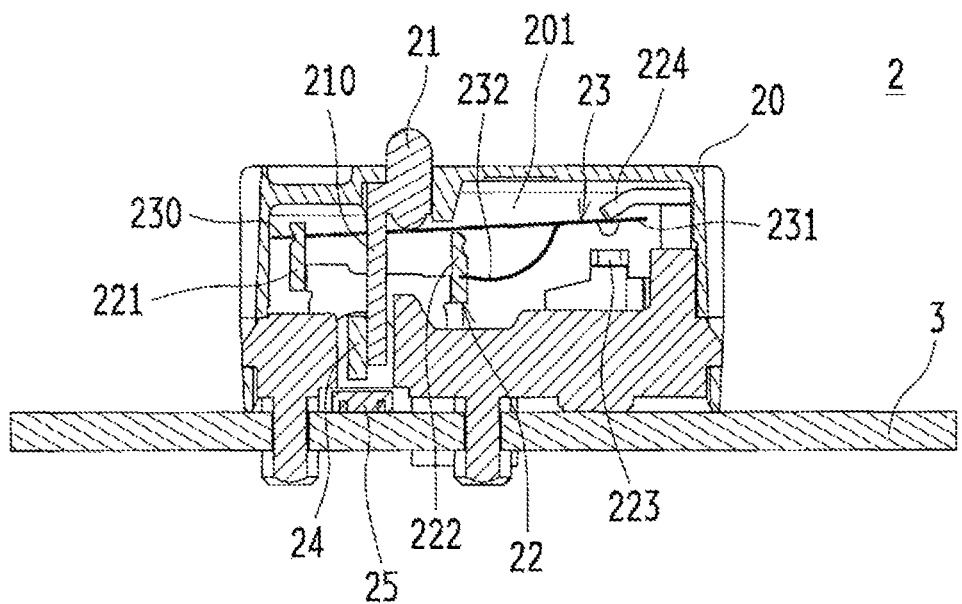
FIG. 33A is a schematic cross-sectional view showing an example of the switch according to the disclosure.
Figure 33B:
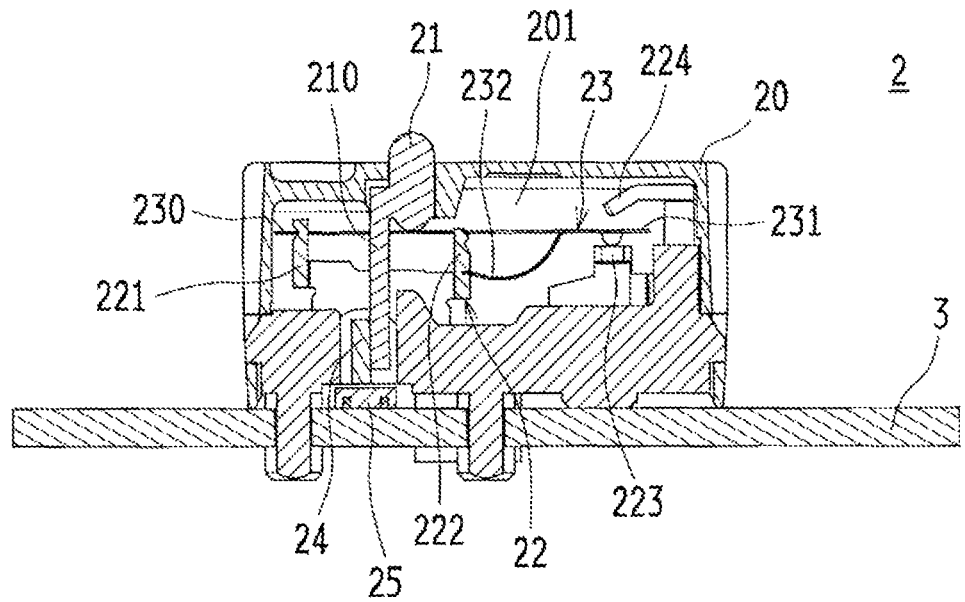
FIG. 33B is a schematic cross-sectional view showing an example of the switch according to the disclosure.

Next, the operation of the switch 2 according to the disclosure will be described. FIG. 33A and FIG. 33B are schematic cross-sectional views showing an example of the switch 2 according to the disclosure. FIG. 33A shows a state where the pressing member 21 does not receive a pressing from the outside, and FIG. 33B shows a state where the pressing member 21 receives a pressing from the outside and moves downward.

When the pressing member 21 moves downward and presses the movable member 23 downward, the second end 231 side of the movable member 23 swings downward, and the movable member 23 contra-rotates and contacts the first contact part 223. Since the movable member 23 collides with the first contact part 223 with the force of the contra-rotation, the user perceives the change in the sound and the pressing load caused by the impact due to the contra-rotation and the collision as the click sound and the click feeling.

Further, as illustrated in FIG. 33A, when the pressing member 21 does not receive a pressing from the outside, the second end 231 of the movable member 23 is located above. The permanent magnet 24 attached to the support body 210 of the pressing member 21 is sufficiently upward and away from the magnetic field detection part 25.

As illustrated in FIG. 33B, when the pressing member 21 receives a pressing from the outside, the pressing member 21 moves downward, and the permanent magnet 24 attached to the support body 210 of the pressing member 21 contacts or approaches the magnetic field detection part 25. As the permanent magnet 24 contacts or approaches the magnetic field detection part 25, the magnetic field detectable by the Hall element of the magnetic field detection part 25 changes. The change of the magnetic field detected by the Hall element is output by the magnetic field detection part 25 as an internal signal, and is output by the switch 2 to the operation device 1 as an ON signal.

As described above, in the switch 2 according to the disclosure, the permanent magnet 24 attached to the support body 210 of the pressing member 21 approaches the magnetic field detection part 25 by the downward movement of the pressing member 21 caused by a pressing from the outside. As the permanent magnet 24 approaches the magnetic field detection part 25, the magnetic field detected by the magnetic field detection part 25 changes. When the magnetic field detected by the magnetic field detection part 25 changes, the switch 2 outputs an ON signal. Further, since the swing of the movable member 23 pressed by the pressing member 21 involves a change in the pressing load and the generation of a collision sound, the user perceives the click feeling and the click sound.

Tenth Embodiment

The tenth embodiment is different from the first embodiment in that the magnetic field detected by the magnetic field detection part 25 is not changed by moving the permanent magnet 24; instead, the magnetic field detected by the magnetic field detection part 25 is changed by shielding/transmitting between the permanent magnet 24 and the magnetic field detection part 25. In the following description, the same components as those in any one of the first embodiment to the ninth embodiment are denoted by the same reference numerals as those in the first embodiment to the ninth embodiment, and the first embodiment to the ninth embodiment are referred to, and the detailed description is omitted.

Figure 34:
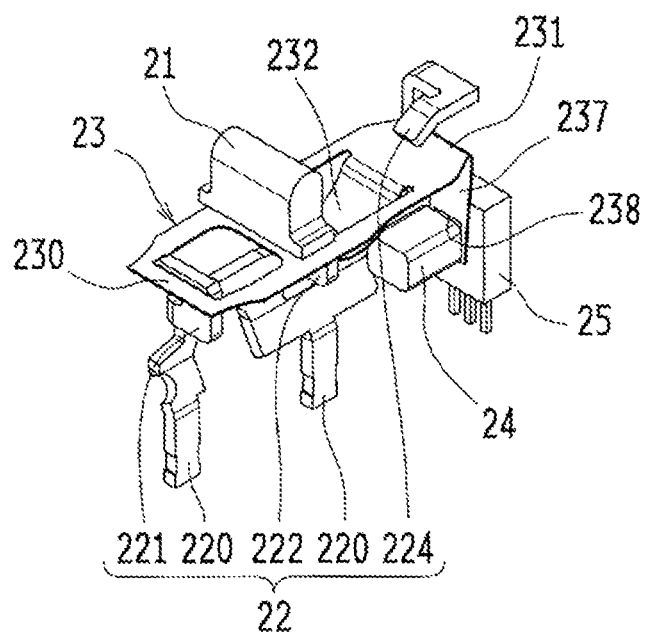
FIG. 34 is a schematic perspective view showing an example of the internal structure of the switch according to the disclosure.
Figure 35:
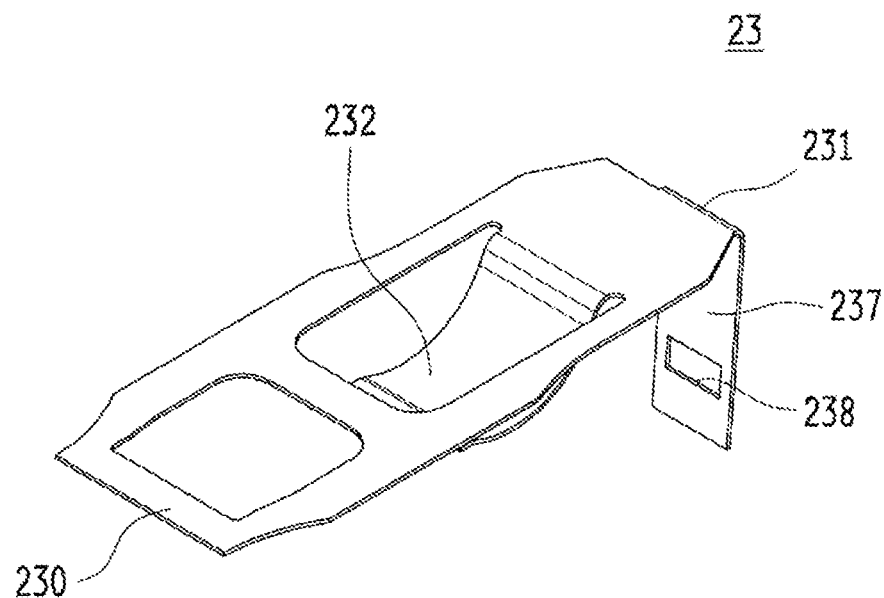
FIG. 35 is a schematic perspective view showing an example of the movable member included in the switch according to the disclosure.
Figure 36:
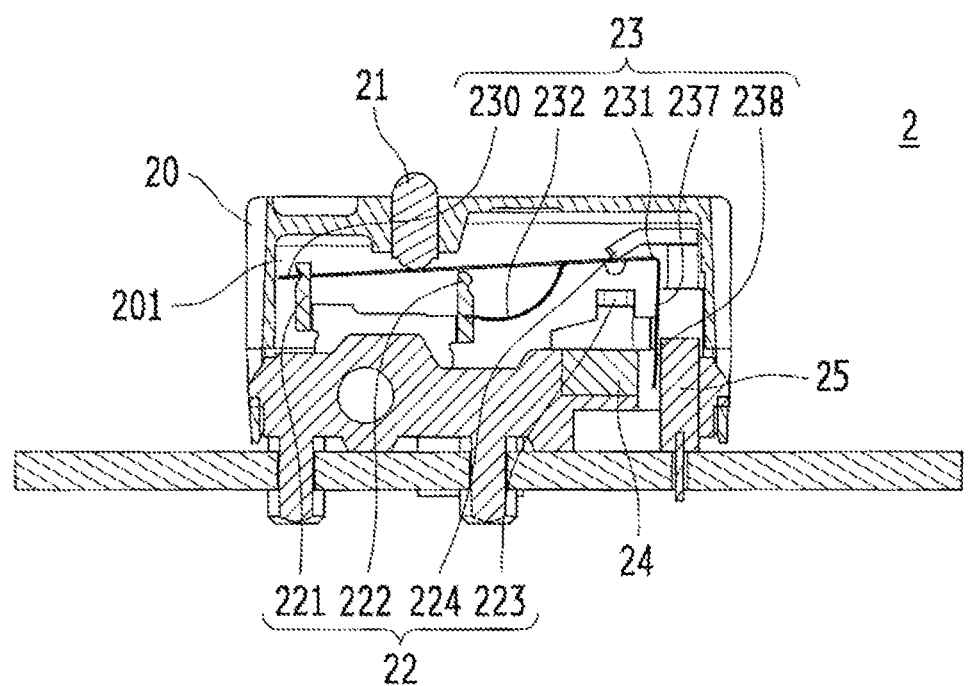
FIG. 36 is a schematic cross-sectional view showing an example of a cross section of the switch according to the disclosure.

FIG. 34 is a schematic perspective view showing an example of the internal structure of the switch 2 according to the disclosure. FIG. 35 is a schematic perspective view showing an example of the movable member 23 included in the switch 2 according to the disclosure. FIG. 36 is a schematic cross-sectional view showing an example of a cross section of the switch 2 according to the disclosure. FIG. 34 is a schematic perspective view showing internal members by removing the housing 20 from the switch 2.

The switch 2 according to the tenth embodiment includes various members such as the locking member 22, the movable member 23, the permanent magnet 24, and the magnetic field detection part 25 as the contact mechanism in the contact chamber 201. The second end 231 side of the movable member 23 has a tip part that is bent downward at a substantially right angle to serve as a shielding piece 237 (shielding part), and a transmission window 238 for transmitting the magnetic field is opened in the vicinity of the center of the shielding piece 237.

In the contact chamber 201, the permanent magnet 24 and the magnetic field detection part 25 are separated from each other with the shielding piece 237 of the movable member 23 interposed therebetween. The permanent magnet 24 is disposed on the left side of the shielding piece 237 and is closer to the center in the housing 20. The magnetic field detection part 25 is disposed on the right side of the shielding piece 237 and is on the side wall side in the housing 20. The magnetic pole of the permanent magnet 24 and the Hall element of the magnetic field detection part 25 are disposed to face each other with the shielding piece 237 interposed therebetween. Since the shielding piece 237 is formed by a paramagnetic material, when the shielding piece 237 is located between the permanent magnet 24 and the magnetic field detection part 25, the magnetic field generated by the permanent magnet 24 is shielded by the shielding piece 237. When the transmission window 238 of the shielding piece 237 is located between the permanent magnet 24 and the magnetic field detection part 25, the magnetic field generated by the permanent magnet 24 passes through the transmission window 238 and reaches the magnetic field detection part 25.

Figure 37A:
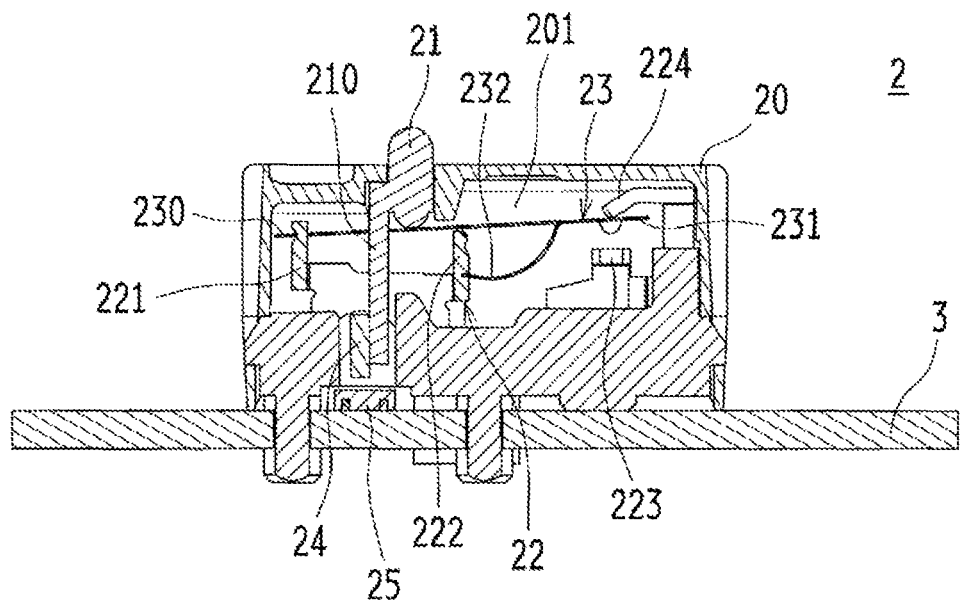
FIG. 37A is a schematic cross-sectional view showing an example of the switch according to the disclosure.
Figure 37B:
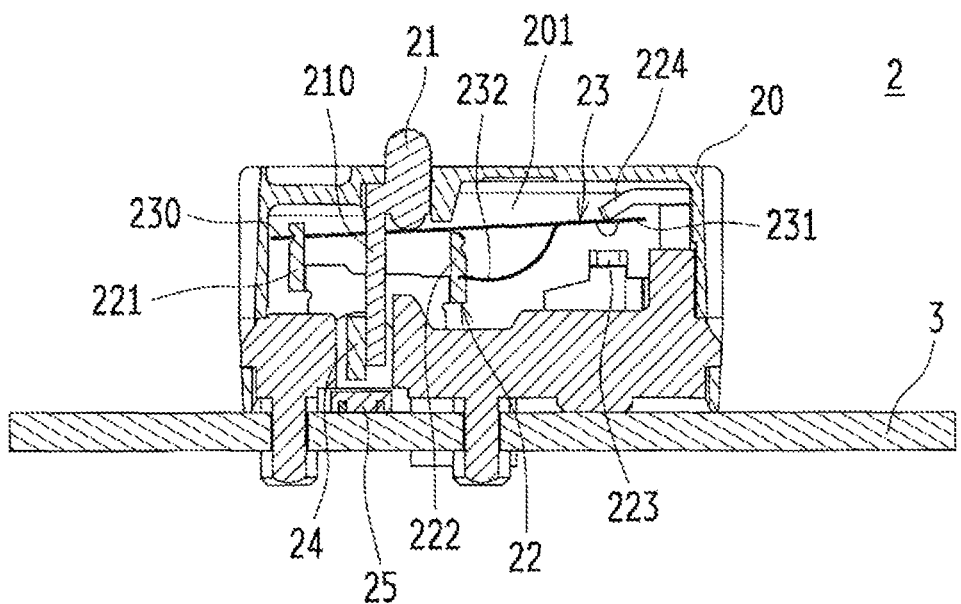
FIG. 37B is a schematic cross-sectional view showing an example of the switch according to the disclosure.
Figure 38A:
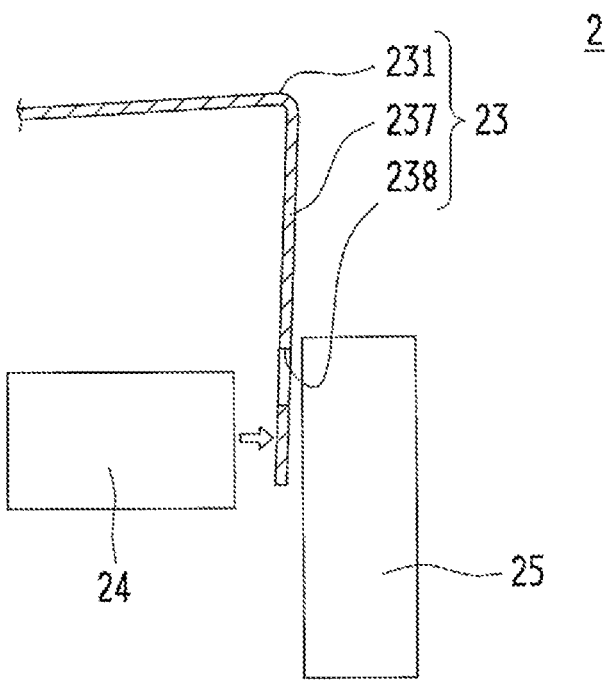
FIG. 38A is a schematic view schematically showing an enlarged view of the vicinity of the shielding piece of the movable member included in the switch according to the disclosure.
Figure 38B:
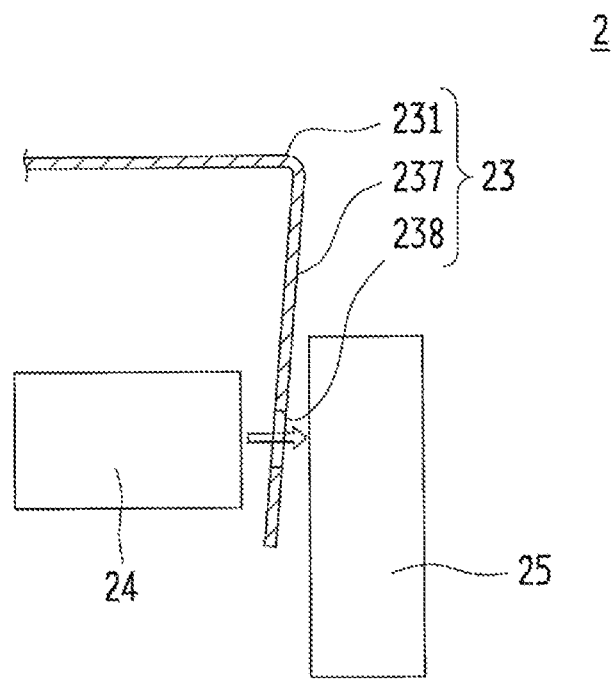
FIG. 38B is a schematic view schematically showing an enlarged view of the vicinity of the shielding piece of the movable member included in the switch according to the disclosure.

Next, the operation of the switch 2 according to the disclosure will be described. FIG. 37A and FIG. 37B are schematic cross-sectional views showing an example of the switch 2 according to the disclosure. FIG. 38A and FIG. 38B are schematic views schematically showing enlarged views of the vicinity of the shielding piece 237 of the movable member 23 included in the switch 2 according to the disclosure. FIG. 37A and FIG. 38A show a state where the pressing member 21 does not receive a pressing from the outside, and FIG. 37B and FIG. 38B show a state where the pressing member 21 receives a pressing from the outside and moves downward.

When the pressing member 21 moves downward and presses the movable member 23 downward, the second end 231 side of the movable member 23 swings downward, and the movable member 23 contra-rotates and contacts the first contact part 223. Since the movable member 23 collides with the first contact part 223 with the force of the contra-rotation, the user perceives the change in the sound and the pressing load caused by the impact due to the contra-rotation and the collision as the click sound and the click feeling.

Further, as illustrated in FIG. 37A and FIG. 38A, when the pressing member 21 does not receive a pressing from the outside, the magnetic field generated by the permanent magnet 24 indicated by the white arrow in FIG. 38A is shielded by the shielding piece 237.

As illustrated in FIG. 37B and FIG. 38B, when the pressing member 21 receives a pressing from the outside, the shielding piece 237 on the second end 231 side of the movable member 23 moves downward, and the transmission window 238 of the shielding piece 237 is located between the magnetic pole of the permanent magnet 24 and the Hall element of the magnetic field detection part 25. In this case, as indicated by the white arrow in FIG. 38B, the magnetic field generated by the permanent magnet 24 passes through the transmission window 238 and reaches the magnetic field detection part 25. The magnetic field detection part 25 detects a change in the magnetic field due to transmission of the originally shielded magnetic field. The change of the magnetic field detected by the magnetic field detection part 25 is output by the magnetic field detection part 25 as an internal signal, and is output by the switch 2 to the operation device 1 as an ON signal. Further, the shielding piece 237 is not limited to being formed by a paramagnetic material but may be formed by a ferromagnetic material as long as the magnetic field can be shielded and transmitted.

As described above, in the switch 2 according to the disclosure, the magnetic field generated by the permanent magnet 24 is transmitted or shielded by the movement of the pressing member 21 caused by a pressing from the outside. When the magnetic field detected by the magnetic field detection part 25 changes, the switch 2 outputs an ON signal. Further, since the swing of the movable member 23 pressed by the pressing member 21 involves a change in the pressing load and the generation of a collision sound, the user perceives the click feeling and the click sound.

As described above by examples in the first to tenth embodiments, the switch 2 according to the disclosure includes a magnet such as the permanent magnet 24 and the magnetized part 234 for generating a magnetic field, and includes the magnetic field detection part 25 with a Hall element. Since a change in the magnetic field detected by the magnetic field detection part 25 becomes a contact of the switch 2, no mechanical contact is required. That is, the switch 2 according to the disclosure does not require a mechanical contact, and can expand the application range of the switch 2 using a magnet. In addition, the contact using the magnetic field detection part 25 has a simpler structure compared with, for example, the case of using a photoelectric contact such as a photosensor, and can suppress the cost required for the element. Further, it is possible to configure to generate a click feeling by the magnet used as a contact, and in this case, it is possible to further simplify the structure and suppress the element cost. In the switch 2 according to the disclosure, the click feeling is realized by, for example, the snap action mechanism of the movable member 23 and the magnetic force of the magnet.

Further, the detection state of the magnetic field of the magnetic field detection part 25 in response to the pressing of the pressing member 21 can be designed as appropriate, and it may be appropriately designed so that in the case of non-pressing, the magnetic field is shielded, and in the case of pressing, the magnetic field is transmitted.

The disclosure is not limited to the first to tenth embodiments described above, but can be developed in other various forms. Therefore, the above-described embodiments are merely examples in every aspect and should not be construed as limiting. The technical scope of the disclosure is described by the claims and is not limited by the specification. Furthermore, all modifications and changes belonging to the equivalents of the claims are within the scope of the disclosure.

For example, in the above embodiments, the first to tenth embodiments have been described as different forms, respectively, but these embodiments may be appropriately modified or put to other uses. For example, a contact mechanism other than the snap action mechanism, as shown in the eighth embodiment, may be applied to other embodiments.

Furthermore, in the above-described embodiments, a mouse has been exemplified as the operation device 1, but the disclosure is not limited thereto, and the disclosure may be applied to various devices such as a power tool and a vehicle-mounted switch.

What is claimed is:

1. A switch comprising:
   a movable member in which a first end side is fixed and a second end side swings when receiving a pressing;
   a pressing member which presses the movable member, wherein the switch outputs a signal based on a swing of the movable member caused by a pressing by the pressing member;
   a magnet;
   a magnetic field detection part which detects a magnetic field; and
   a pusher which moves in response to a pressing of the movable member,
   wherein a magnetic field generated by the magnet and detected by the magnetic field detection part is changed due to the pressing of the pressing member, and
   a signal is output based on the magnetic field detected by the magnetic field detection part,
   wherein the magnetic field detected by the magnetic field detection part changes as the magnet operates with respect to the magnetic field detection part due to the swing of the movable member caused by the pressing of the pressing member,
   wherein the movable member is configured to press the pusher by swinging,
   the pusher is configured to press the magnet by movement caused by a pressing, and
   the magnetic field detected by the magnetic field detection part changes as the magnet operates in response to a pressing.

2. The switch according to claim 1,
   wherein the pusher is configured to move toward the magnetic field detection part by the pressing of the movable member, and
   the pusher is configured to press the magnet in a direction different from a movement direction.

3. The switch according to claim 1, further comprising:
   a connection member magnetically connectable to two poles of the magnet,
   wherein the magnet and the connection member are disposed in a way in which one of the magnet and the connection member is movable toward and away from the other, and the magnetic field generated by the magnet is detectable by the magnetic field detection part in a case where the magnet and the connection member move away from each other, and
   the pusher is configured to move in a way in which one of the magnet and the connection member is magnetically connected to or separated from the other due to the pressing of the movable member.

4. An operation device comprising: a pressing operation part which receives a pressing operation from outside; and the switch according to claim 1, wherein the pressing operation received by the pressing operation part is transmitted as a pressing from the outside.

5. A switch comprising:
a movable member in which a first end side is fixed and a second end side swings when receiving a pressing;
a pressing member which presses the movable member, the switch outputs a signal based on a swing of the movable member caused by a pressing by the pressing member;
a magnet; and
a magnetic field detection part which detects a magnetic field,
wherein a magnetic field generated by the magnet and detected by the magnetic field detection part is changed due to the pressing of the pressing member, and
a signal is output based on the magnetic field detected by the magnetic field detection part, wherein the magnet and the magnetic field detection part are disposed to face each other,
the movable member has a shielding part located between the magnet and the magnetic field detection part on the second end side, and
the magnetic field detected by the magnetic field detection part changes due to an operation of shielding or transmitting the magnetic field that reaches the magnetic field detection part from the magnet due to the swing of the movable member caused by the pressing of the pressing member.

6. The switch according to claim 5, wherein the shielding part is formed by a paramagnetic material or a ferromagnetic material.

7. An operation device comprising: a pressing operation part which receives a pressing operation from outside; and the switch according to claim 5, wherein the pressing operation received by the pressing operation part is transmitted as a pressing from the outside.

\* \* \* \* \*